US008410667B2

(12) United States Patent
Rastegar et al.

(10) Patent No.: US 8,410,667 B2
(45) Date of Patent: Apr. 2, 2013

(54) ELECTRICAL GENERATORS FOR LOW-FREQUENCY AND TIME-VARYING ROCKING AND ROTARY MOTIONS

(75) Inventors: Jahangir S. Rastegar, Stony Brook, NY (US); Thomas Spinelli, Northport, NY (US); Richard T. Murray, Patchogue, NY (US)

(73) Assignee: Omnitek Partners LLC, Ronkonkoma, NY (US)

( * ) Notice: Subject to any disclaimer, the term of this patent is extended or adjusted under 35 U.S.C. 154(b) by 248 days.

(21) Appl. No.: 12/855,688

(22) Filed: Aug. 12, 2010

(65) Prior Publication Data

US 2011/0193350 A1 Aug. 11, 2011

Related U.S. Application Data

(63) Continuation-in-part of application No. 12/142,739, filed on Jun. 19, 2008, now Pat. No. 7,821,183.

(51) Int. Cl.
*H01L 41/113* (2006.01)
(52) U.S. Cl. ........................................ 310/339
(58) Field of Classification Search .................. 310/339
See application file for complete search history.

(56) References Cited

U.S. PATENT DOCUMENTS

| 2,921,252 | A | * | 1/1960 | Schiavone | 322/2 R |
| 3,350,583 | A | * | 10/1967 | Schiavone | 310/319 |
| 3,539,841 | A | * | 11/1970 | Riff | 310/339 |
| 4,853,580 | A | * | 8/1989 | Sula | 310/339 |
| 5,814,921 | A | * | 9/1998 | Carroll | 310/339 |
| 6,307,304 | B1 | * | 10/2001 | Yorio et al. | 310/339 |
| 7,821,183 | B2 | * | 10/2010 | Rastegar | 310/339 |
| 2006/0175937 | A1 | * | 8/2006 | Clingman et al. | 310/339 |
| 2006/0273693 | A1 | * | 12/2006 | Genis et al. | 310/339 |
| 2008/0136290 | A1 | * | 6/2008 | Lee | 310/319 |
| 2010/0052324 | A1 | * | 3/2010 | Priya | 290/50 |
| 2010/0141095 | A1 | * | 6/2010 | Park | 310/339 |

FOREIGN PATENT DOCUMENTS

| JP | 2003-061367 A | * | 2/2003 |
| JP | 2003-061369 A | * | 2/2003 |
| WO | WO-2005-069959 A2 | * | 8/2005 |

* cited by examiner

*Primary Examiner* — Thomas Dougherty

(57) ABSTRACT

An apparatus for generating electrical energy from a first motion having a low and/or variable frequency. The apparatus including: a first device to which the first motion is transferred; and a second device to which the first motion is transferred from the first device, the second device operating at a second motion having a frequency which is higher and/or more constant that the first motion. Wherein the first device comprises one of a first rotating shaft or first translating mass; the first shaft or first mass includes a tip interacting with the second device to transfer the first motion thereto, the second device comprises a mechanism having an electrical energy generator for converting the second motion to electrical energy; and the electrical energy generator comprises a rotary or linear coil and magnet generator or a piezoelectric generator. The interaction of the tip with the shaft or mass can be contactless.

17 Claims, 20 Drawing Sheets

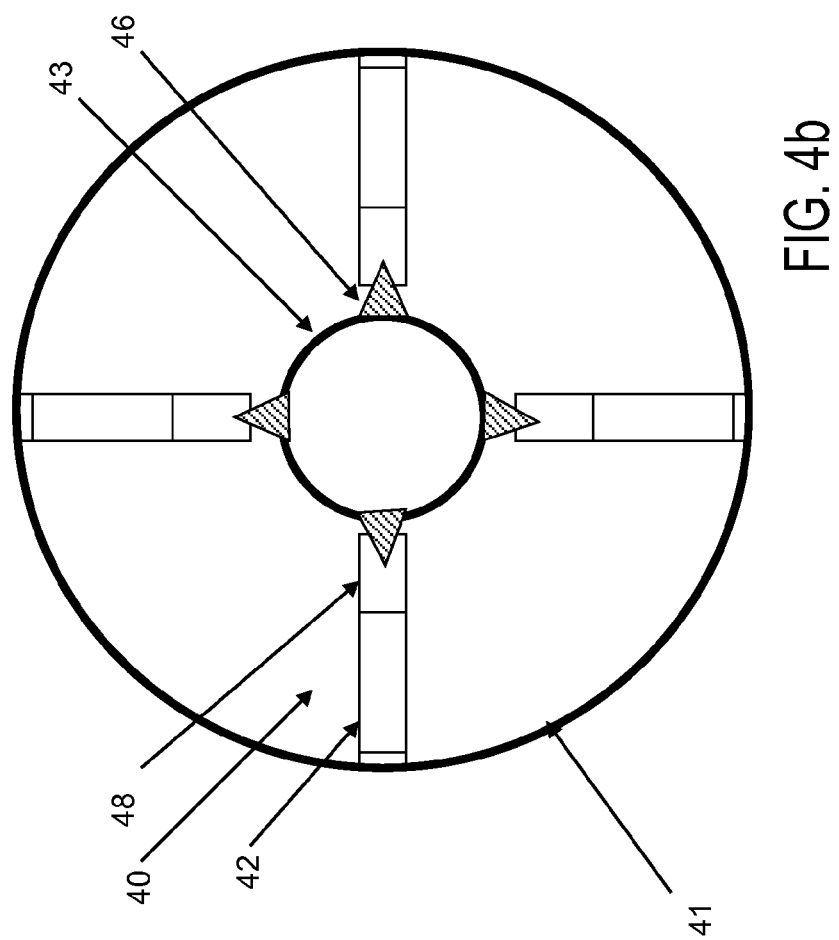

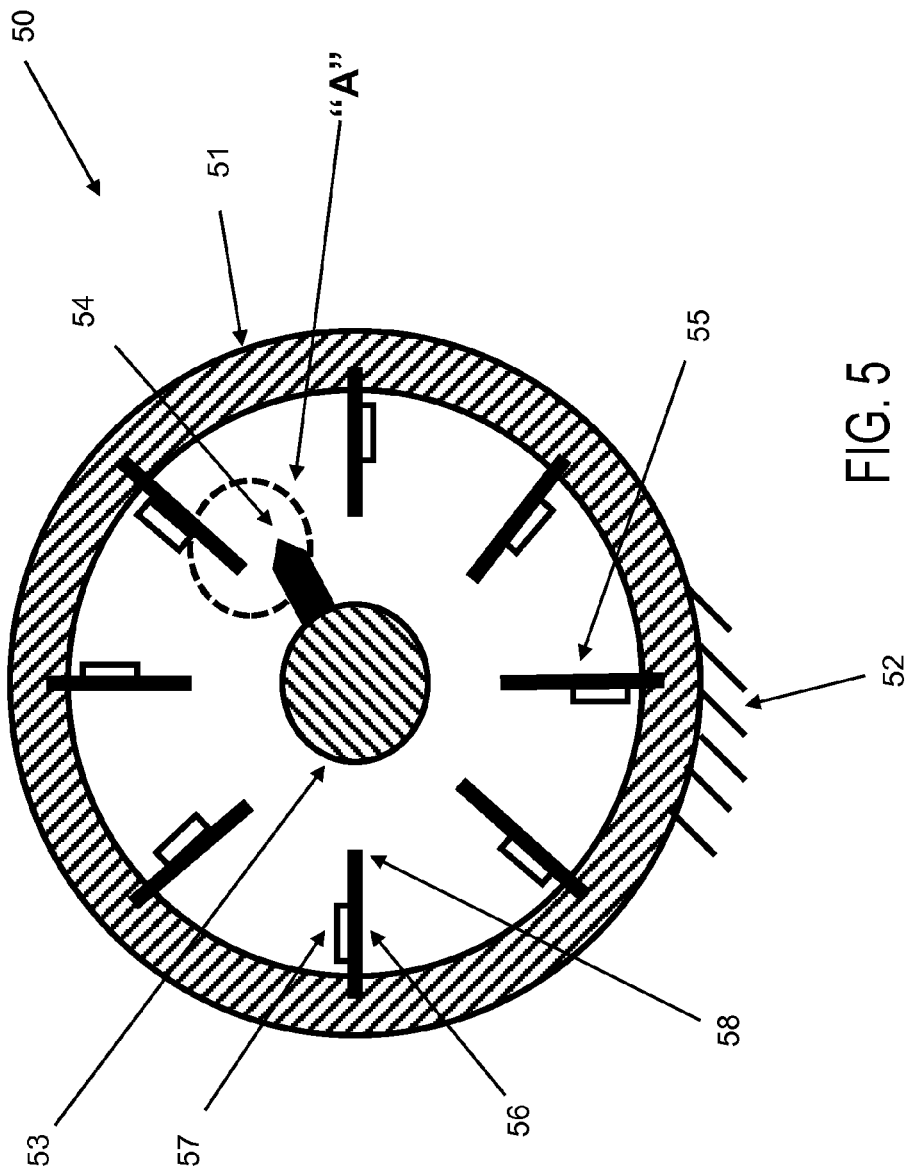

ELECTRICAL GENERATORS FOR LOW-FREQUENCY AND TIME-VARYING ROCKING AND ROTARY MOTIONS

CROSS-REFERENCE TO RELATED APPLICATION

This application is a Continuation-In-Part of U.S. application Ser. No. 12/142,739 filed on Jun. 19, 2008, the contents of which is incorporated herein by reference.

BACKGROUND OF THE INVENTION

1. Field of the Invention

The present invention relates generally to electrical generators, and more particularly to electrical generators for low-frequency and time-varying rocking and rotary motions.

2. Prior Art

In recent years, particularly following the development of low-power electronics, sensors and wireless communications devices, electrical energy generators that harvest energy from the environment have seen renewed attention. The most common means of generating electrical energy is the use of magnets and coils using rotary type of generators. Generators that harvest energy from vibration that use either coils and magnets or active materials such as piezoelectric materials based devices have also been developed, particularly for low power consuming electronics. In the latter area, piezoelectric materials have been used widely to generate electrical energy from the ambient vibration. See e.g., Sodano, H. A., Inman, D. J., and Park, G., 2004, "A Review of Power Harvesting from Vibration using Piezoelectric Materials," *The Shock and Vibration Digest*, Vol. 36, No. 3, 197-205.

To efficiently generate electrical energy from mechanical energy using active materials such as piezoelectric elements or by using various types of magnets and coils arrangements, the frequency of the input motion must be relatively high and not time varying. This means that if the input motion is rotary, then the rotational velocity must be relatively constant and high, preferably in the order of several thousands. On the other hand, if the motion is oscillatory, such as vibratory or rocking or the like, then the frequency of vibration or rocking must be high, preferably in the order of a few thousands when using magnet and coil type of mechanical to electrical energy conversion devices and even higher frequencies if, for example, piezoelectric based of mechanical to electrical energy conversion devices are employed.

However, in many applications, for example in platforms that rock through relatively small angles such as ships, trains or trucks; the rocking or oscillating frequency is very low and even in the order of 0.2-0.5 Hz and time varying, thereby making the operating of all currently available energy harvesting devices, i.e., mechanical energy to electrical energy conversion devices, extremely inefficient. Similarly, in rotary machinery such as windmills or turbines used to harvest tidal or ocean waves or other similar flows, the input rotary speed is relatively low and varies significantly over time, thereby making the operation of all currently available electrical energy generators highly inefficient. In fact, in most such turbo-machinery, such as windmills, to make the generation cycle efficient, gearing or other similar mechanisms have to be used to increase the output speed and in many applications to also regulate the output speed. Input speed increasing gearing and speed control mechanisms are, however, costly and significantly increase the system complexity and cost, particularly those related to maintenance and service.

SUMMARY OF THE INVENTION

There is therefore a need for a method that can be used to develop electrical energy generators that could efficiently generate electrical energy from slow and time varying rocking (oscillatory) platforms and rotary input motion. To achieve high mechanical energy to electrical energy conversion efficiency, the above method can lead to generators that operate at high and relatively constant input motion frequencies.

In particular, there is a need for energy harvesting generators that could efficiently generate electrical energy from the motion of platforms that rock through relatively small angles such as ships, trains or trucks, in which the rocking frequency could vary significantly over time and even from one cycle of rocking motion (oscillation) to the next, with frequencies that could even be in the order of 0.1-0.5 Hz or even lower.

There is also a particular need for efficient electrical energy generators for rotary machinery, such as windmills and/or turbines, used to harvest tidal or ocean waves or other similar flows and the like in which the input motion varies widely and could even reverse, with input rotational velocities that could be very low, even of the order of 5-10 round per minute (rpm) or even lower. In particular, there is a need for such electrical energy generators to operate without the need for costly speed increasing and regulating devices that significantly increase the equipment cost as well as maintenance and service costs and result in significant amount of down time.

Accordingly, a method is provided for electrical energy generators to harvest electrical energy, i.e., convert mechanical energy to electrical energy, from slow and time varying rocking (oscillatory) platforms and rotary input motion. With this method, the generator device does not require devices such as speed increasing devices and/or speed regulating devices. In addition, the disclosed method can provide the means to develop highly efficient mechanical energy to electrical energy conversion devices since the resulting mechanical to electrical energy conversion devices can operate at appropriately high and relatively constant input motion frequencies.

In addition, a new class of highly efficient piezoelectric based energy harvesting electrical energy generators is provided that can mount on platforms that oscillate (rock or vibrate) at relatively low to moderate frequencies based on the aforementioned method. The maximum amount of available mechanical energy during each cycle of platform oscillation (rocking motion) can be proportional to the inertia of the oscillating element; the frequency and amplitude of platform vibration; and the size of the generator.

Furthermore, electrical energy generators are provided for rotary machinery in which the input rotary speed can be relatively low and vary significantly over time such as in wind mills, turbo-machinery used to harvest tidal flows or ocean waves, and the like.

Such generators can be based on piezoelectric elements to convert mechanical energy to electrical energy. However, it is appreciated by those familiar with the art that other active materials or appropriate coil and magnet type of mechanical to electrical energy conversion devices can be used instead of or in combination with piezoelectric elements.

The present methods can include two-stage mechanisms or operation. The input (rocking or oscillatory or rotary) motion can drive the first stage mechanisms. The first stage mechanism in return can affect repeated vibration of at least one vibrating element that is tuned to vibrate at a fixed prescribed frequency. The mechanical energy stored in the vibrating elements can be then transformed into electrical energy using piezoelectric elements, even though coil and magnet type of electrical energy generating devices could also be used.

The electrical energy generators can be very simple, can efficiently operate over a very large range of input oscillatory frequencies or rotary speeds, and can require minimal service and maintenance.

BRIEF DESCRIPTION OF THE DRAWINGS

These and other features, aspects, and advantages of the apparatus of the present invention will become better understood with regard to the following description, appended claims, and accompanying drawings where:

FIG. 4b illustrates a plan view of the two-stage energy harvesting device of FIG. 4a.

FIG. 5 illustrates a two-stage generator for harvesting energy from slow and varying rotary motion.

DETAILED DESCRIPTION OF THE PREFERRED EMBODIMENT

Figure 1:
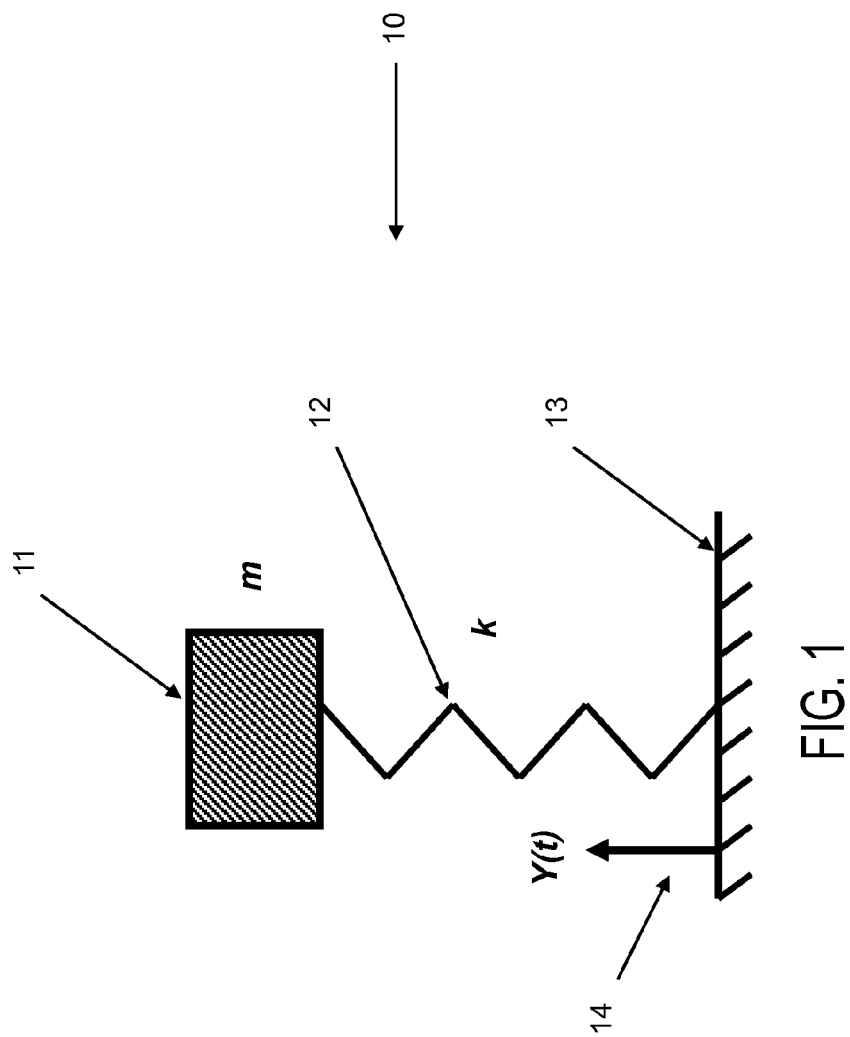
FIG. 1 illustrates a schematic view of a mass-spring system mounted on a vibrating platform that is vibrating in the vertical direction.

For a vibrating platform, first consider the amount of mechanical energy that is made available by the platform for harvesting. Consider the mass-spring system 10, with a mass element m and a spring element k, indicated by numerals 11 and 12, respectively, as shown in FIG. 1. The mass-spring system 10 is mounted on a vibrating platform 13 that is vibrating in the vertical direction indicated by the vector Y(t) and enumerated as 14. Assume that the platform vibrating Y(t) is a simple harmonic motion with a frequency $\omega$ and amplitude A. Thus, if the natural frequency of the mass-spring system is well above that of $\omega$ and damping is negligible, during each cycle of platform motion, the mass m is raised and then lowered a total maximum distance of 2 A, i.e., its potential energy is varied by a maximum amount of 2 Amg, where g is the gravitational acceleration. Here, it is assumed that the inertia of the vibrating platform is significantly larger than that of the mass-spring system. Thus, 2 Amg is the maximum amount of energy that a vibrating platform can transfer to the vibrating mass-spring system, assuming that there are no losses. This is therefore the maximum amount of energy that becomes available during each cycle of platform vibration for harvesting and transferring into electrical energy. In addition, if the frequency of vibration of the platform $\omega$ is indicated in cycles/sec (Hz), the maximum amount of power that could possibly be harvested becomes (2 Amg$\omega$). If the amplitude A is in meters, the mass m is in kg, g is in meter/second square, and $\omega$ in Hz, the above power will have the units of Watts.

As expected, the maximum amount of mechanical energy that is available for harvesting is proportional to the amplitude of the platform vibration and the inertia of the energy harvesting power source. Thus, given a vibrating platform, the only parameter that can be varied to increase the available energy for harvesting is the inertia of the mass-spring system of the energy harvesting power source, while using a properly designed spring element 12. However, by increasing the inertia (mass) of the energy harvesting power source, its size is also generally increased. It can therefore be concluded that to minimize the size of energy harvesting power sources for a specified power requirement, the vibrating mass can be constructed with high-density materials, most of the components of the power source system can be mounted onto the vibrating mass to maximize the inertia of the mass-spring system without increasing the overall size of the power source.

Figure 2:
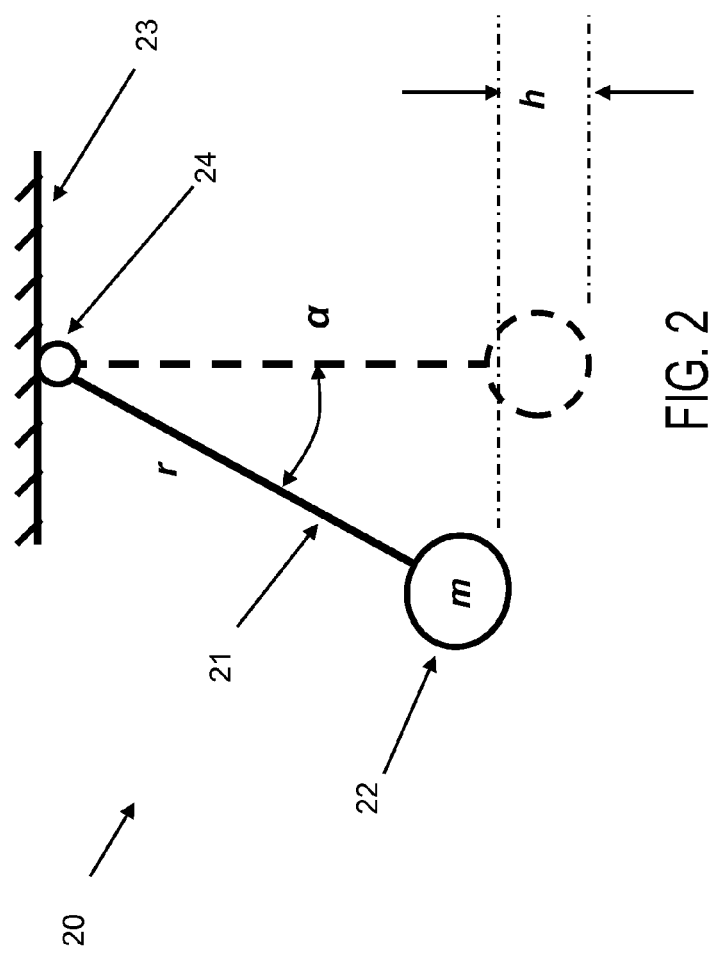
FIG. 2 illustrates a schematic view of a pendulum system mounted on a rotating platform.

If the oscillatory motion of the platform is rotational, such as the rocking motion of a ship, then the simplest method of generating potential energy for harvesting is the use of a pendulum 20, FIG. 2, or some other pendulum-like mechanism. In FIG. 2, a pendulum 20 of length r and carrying a mass m, indicated by numerals 21 and 22, respectively, is shown. The pendulum 20 is attached to the rocking platform 23 at the pin joint 24. If the amplitude of the platform rotational oscillations is $\alpha$, a properly designed pendulum would undergo oscillations of the same amplitude. During each cycle of its oscillations, the pendulum mass m is raised twice a distance h (FIG. 2) above its vertical positioning indicated by dashed lines, thereby giving it a relative potential energy mgh. The distance $h=r(1-\cos \alpha)$ is proportional to the length r. Therefore, to increase the amount of mechanical energy available for harvesting, the energy harvesting generators have to be constructed as a tall pendulum, which is not considered to be practical. Alternatively, the device could be made wider to accommodate a series of parallel pendulums, or a traveling mass, which is in fact a pendulum with infinite arm length r as described later in this disclosure.

In general, most mechanical to electrical energy conversion devices, including those based on piezoelectric elements and those based on magnets and coils, and their electronics are not efficient when operated at very low frequencies. The efficiency of such systems is also increased if the frequency of vibration is relatively constant. Novel methods are therefore needed for the development of electrical energy generators that could efficiently harvest energy from the present platforms with low and time varying frequency oscillatory or rotary motions.

To this end, a novel method is disclosed that is based on a two-stage energy harvesting strategy to address the aforementioned problems of slow and highly variable input rotary motions and vibrating platforms with low and time varying frequency oscillations. In this novel method, the first stage of the energy harvesting generator consists of the input system with the rotary or oscillatory motion, such as the aforementioned pendulum, hereinafter called the "primary system". Mechanical energy is then transferred intermittently from the "primary system" to one or more "secondary vibrating systems" with relatively high and fixed natural frequencies. The mechanical energy is then harvested efficiently from the secondary systems using one or more types of mechanical energy to electrical energy conversion devices such as those based on piezoelectric or other similar active materials or magnet and coil based devices.

Figure 3:
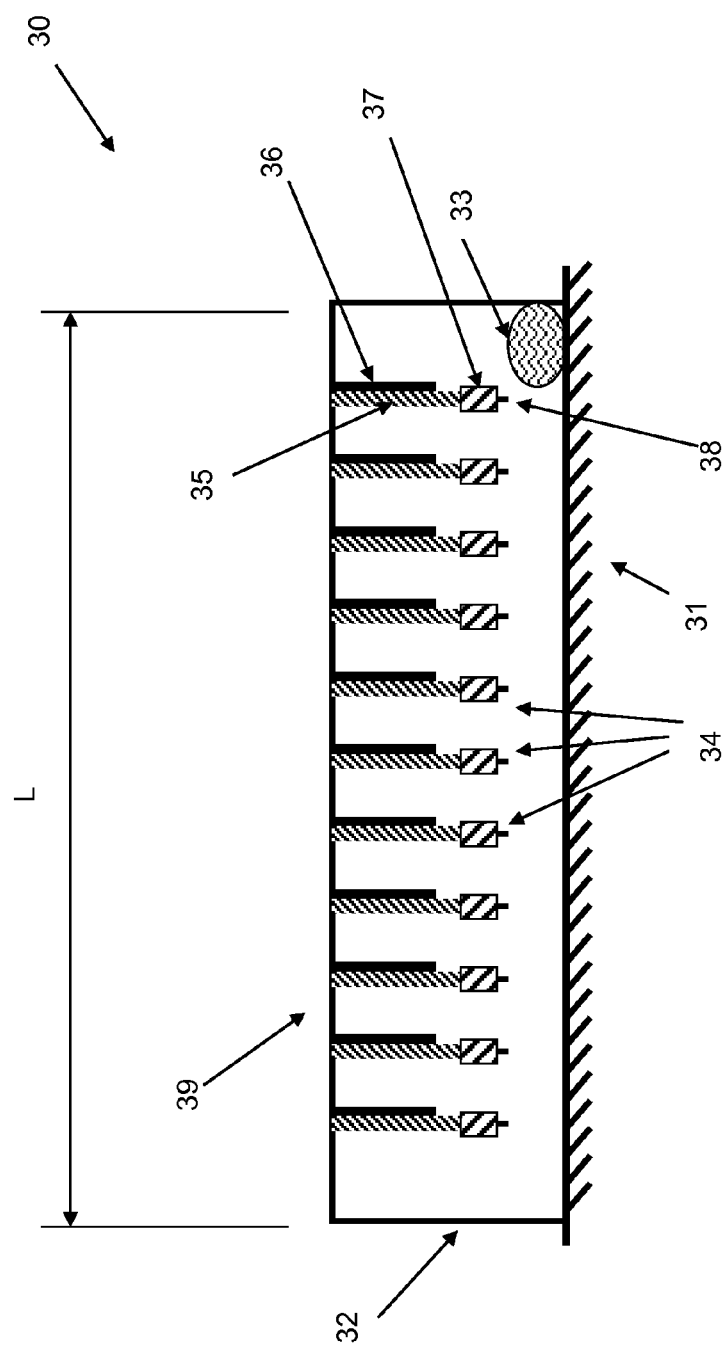
FIG. 3 illustrates a two-stage energy harvesting device for slow and variable input rotary motions with low and time varying frequency oscillations.

The above novel two-stage energy harvesting method for rocking platforms is best described by the following basic embodiment 30, which is shown schematically in FIG. 3. The primary system of the embodiment 30 consists of a simple housing 32, which is attached directly to the rocking platform 31. The rocking oscillation of the platform 31 is considered to be about an axis perpendicular to the plane of the page. As the platform 31 undergoes rotary oscillation, the traveling mass 33 begins to slide from the side that has been raised, travels the length of the housing 32 and ends on its opposite end of the housing. At least one secondary vibratory element 34 is attached to the top portion 39 of the housing 32. Each vibratory element consists of a relatively flexible beam 35, to the tip of which is preferably attached a mass 37 to allow for optimal tuning of the natural frequency of the first mode of vibration of the vibratory elements. The tip of the beam 35 and mass 37 assemblies is preferably provided with a pointed tip 38 for engagement with the traveling mass 33 as described below.

As the traveling mass 33 passes the secondary vibratory elements 34, it engages their free tips 38 and causes the beams 35 to bend slightly in the direction of its travel. The traveling mass 33 then passes under an engaged secondary vibratory element 34, moving to the next secondary vibratory element 34. The potential energy stored in the released beam element 35 causes it to vibrate. A mechanical to electrical energy conversion means such as a piezoelectric element 36 that is attached to the surface of the beam element can then be used to harvest the available mechanical energy and convert it to electrical energy for collection by an appropriate electronics circuitry (not shown) and direct usage or storage in a storage device such as a capacitor or rechargeable battery (not shown). Such electronics circuits for collecting the charges generated by piezoelectric or other similar elements and storing them in storage devices such as capacitors and/or rechargeable batteries are well known in the art.

All contacting surfaces can be designed to minimize frictional losses. The spacing of the secondary vibratory elements and the total deflection of the beams 35 and their bending stiffness can also be selected to maximize the transfer of potential energy from the traveling mass 33 to the secondary vibratory elements and to ensure that the total potential energy stored in each beam element 35 is harvested by the piezoelectric elements 36 before the next strike of the traveling mass 33. As can be seen, during each cycle of oscillation of the rocking platform 31, each secondary vibratory element is struck twice by the traveling mass 33.

The amount of mechanical energy available can be seen to be proportional to the width L, of the housing 32 of the energy harvesting device 30, and the mass of the traveling mass 33. Such energy harvesting power sources 30 are relatively long but can have fairly low profile. For example, if the traveling mass has a mass of m=0.2 kg, the rocking frequency is $\omega=0.3$ Hz, the width of the energy harvesting power source is L=0.5 m and the rocking amplitude is $\alpha=5$ deg., the maximum mechanical power that is available for harvesting is $$P_{max} = 2\, m\, g\, \omega\, L\, \sin(\alpha) = 0.051 \text{ W or } 51 \text{ mW}$$

where g is the gravitational acceleration.

Figure 3B:
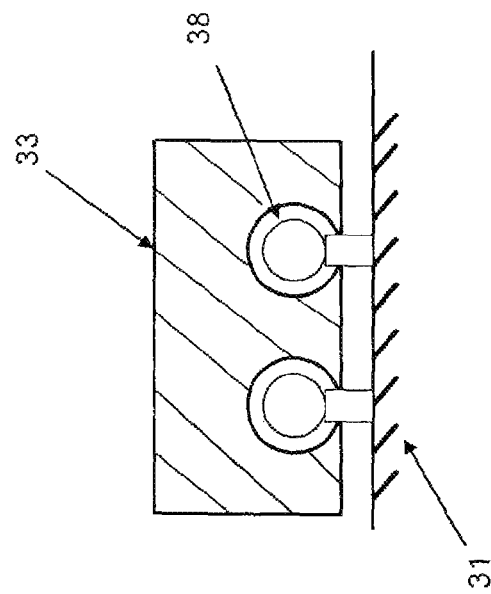
FIGS. 3a and 3b show first and second variations of means by which the mass moves in the two-stage energy harvesting device of FIG. 3.
Figure 3A:
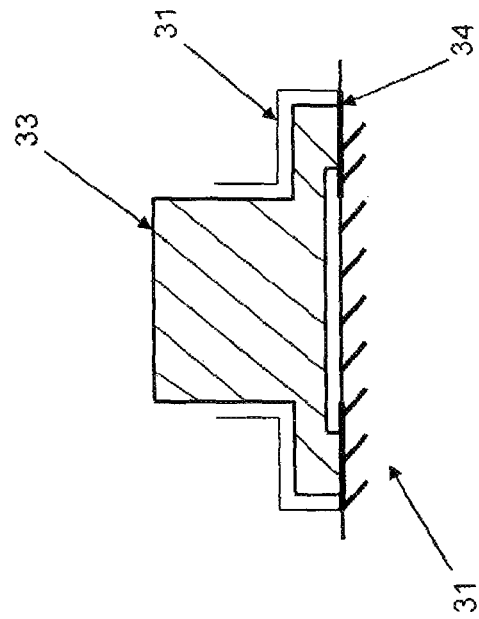

The basic embodiment shown in FIG. 3 can be developed into numerous different designs with the common characteristic of being designed with two stages, a primary stage that transforms the low and variable frequency and usually small amplitude oscillations (or slow and variable input rotation) into potential energy that becomes available to a secondary stages of vibrating elements with significantly higher and fixed frequency of vibration appropriate for efficient energy harvesting utilizing various means such as piezoelectric elements. In the embodiment of FIG. 3, the two-stage energy harvesting power source design was described with an example of its application to platforms that undergo rocking (rotary) oscillations. The oscillation may, however, be translational or be in the form of the combination of the two. The traveling mass 33 can move along the length L in many ways, such as rolling or translating and may be free to do so or guided on a track 31 as shown in FIG. 3a or rails 38 as shown in FIG. 3b. Low friction materials 34 can be used where the mass 33 contacts the track 31.

It is noted that one major source of loss in devices such as the embodiment of FIG. 3 is the mechanical interface where the traveling mass 33 (i.e., the exciter element) contacts the secondary vibratory elements 34, i.e., the tip elements 38. To eliminate these contact losses, non-contacting magnet elements can be employed, preferably on both traveling mass 33 surface and on the tips 38 of the secondary vibratory elements 34. The two magnets are preferably of opposite poles and as the traveling mass 33 passes under the tip 38 of a secondary vibratory element 34, the two magnets are attracted to each other and as the traveling mass 33 has moved a far enough distance, the secondary vibratory element 24 is released and begin to vibrate, primarily at the frequency of its first mode of vibration. Such an arrangement would allow for a strong interaction between exciters and secondary elements owing to the close proximity of opposite poles. Arrangements using such magnetic means of exciting the secondary vibratory elements are discussed below with regard to further embodiments.

In another embodiment, two-stage energy generators are provided for harvesting mechanical energy and converting it to electrical energy for platforms with low-frequency translational oscillations. Consider the mass-spring system 10 shown in FIG. 1. The platform 13 undergoes a vertical displacement Y(t) in the direction of the arrow 14. The displacement Y(t) causes the mass-spring system 10 to vibrate. The mechanical energy transferred to the mass-spring system is obviously the largest if the motion is a simple harmonic with a frequency that is equal or close to the natural frequency of the mass-spring system 10.

Figure 4:
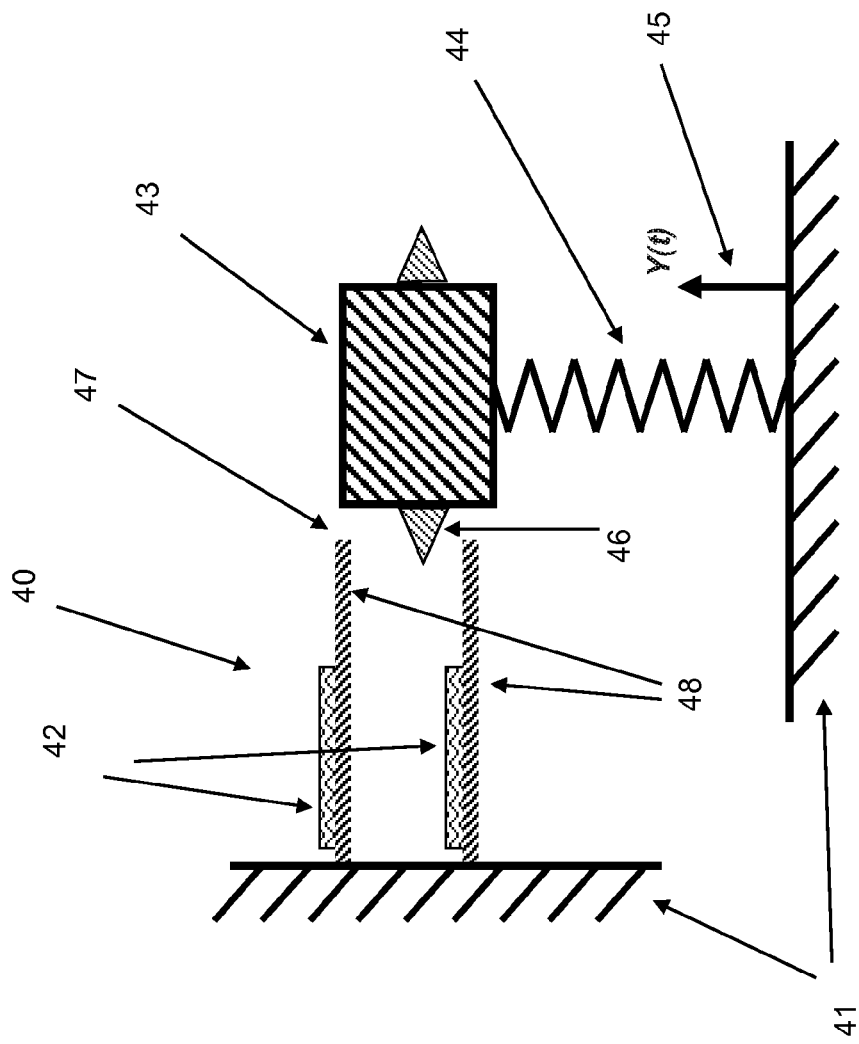
FIG. 4 illustrates two-stage energy harvesting device for slow and variable input vibrating platforms with low and time varying frequency oscillations.

If the amplitude of oscillations of the vibrating platform 13 is relatively large, enough mechanical energy could transfer to the mass-spring system 10 during each cycle of platform 13 motion. This mechanical energy can then be transformed into electrical energy, e.g., by attaching the spring element via a piezoelectric stack to either the moving platform 13 or the mass element 11. However, if the frequency of vibration of the base platform 13 is low, it is difficult to efficiently transfer the aforementioned mechanical energy into electrical energy. For such applications, the present two-stage method provides the means to transfer the mechanical energy from the mass-spring system 10 shown in FIG. 1, i.e., the primary stage, to the secondary vibratory systems 40 with appropriately high natural frequencies as shown in FIG. 4, the operation of which is described below. As a result, the mechanical energy transferred to the primary system is available for transformation into electrical energy at a significantly higher efficiency.

The embodiment of FIG. 4 operates as follows. The mass-spring element (mass 43 and spring 44), i.e., the primary stage, is attached to the base platform 41, which is oscillating vertically in the direction of the arrow 45. The vertical oscillation of the platform 41 is given by the function Y(t). At least one secondary vibratory system 40 is attached to the platform 41 or any other adjacent structure. In the schematic of FIG. 4, the secondary vibratory systems 40 are constructed as beam elements 48, to the surface of each of which a mechanical to electrical energy conversion devices 42 (preferably bimorph piezoelectric elements operating in tension and compression layers as the beam 48 vibrates) are attached. As the base platform 41 oscillates in the direction of the arrow 45, if the natural frequency of the mass 43 and spring 44 system is appropriately selected, i.e., if it is close to the frequency of oscillation of the base platform 41, then a significant amount of available energy is transferred to the mass 43 and spring 44 system. With continued base platform oscillation, the amplitude of oscillation of the mass 43 and spring 44 system increases, until the tip of the protruding element 46 reaches the tip 47 of the beam elements 48 and excite its natural mode of vibration. As a result, part of the mechanical energy of the mass 43 and spring 44 system is transferred to the secondary vibratory systems 40. The elements 42 are then used to transform the mechanical energy of the systems 40 to electrical energy. An appropriate electronics circuitry (not shown) can then harvest the generated electrical energy and direct it for use by certain load or for storage in appropriate electrical energy storage devices such as capacitors and/or rechargeable batteries. The above methods and devices for harvesting the electrical and regulating it for direct use or for storage in capacitors and rechargeable batteries are well known in the art.

It is noted that during each cycle of primary stage oscillation, the entire available mechanical energy does not have to be transferred to the secondary vibratory systems since the transferred mechanical energy could accumulate in the primary stage and be transferred to the secondary vibratory systems in the consequent cycles of primary stage oscillation.

It is noted that the design presented in the schematics of FIG. 4 is merely for the sake of illustrating the method of operation of the embodiment. In practice, however, such two-stage energy harvesting power sources may be designed in a variety of different types. For example, contact between the tips 46 and 47 would result in rapid wear and inefficiency in the transfer of the mechanical energy from the primary stage to the secondary vibratory elements. To make the operation of such a system significantly more efficient, opposing pole magnets can be used instead of physically contacting tips 46 and 47, as was described previously.

Figure 4A:
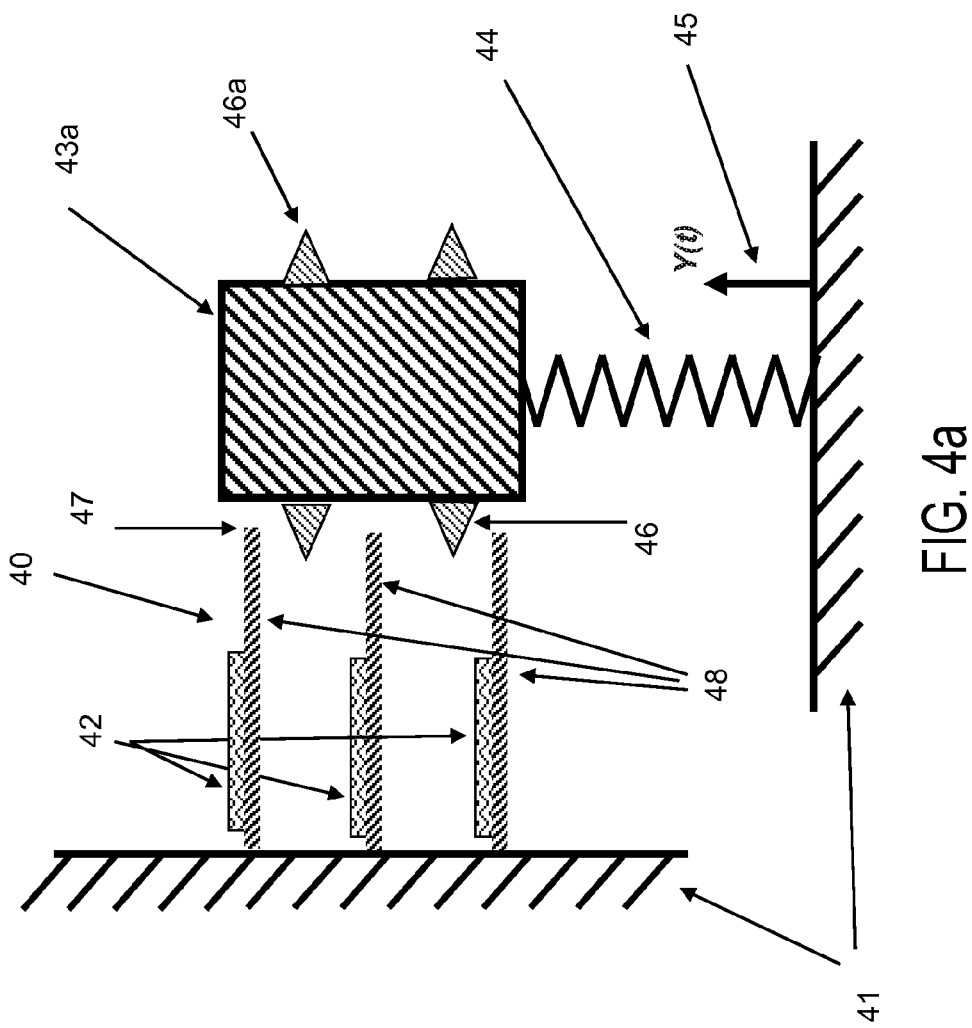
FIG. 4a illustrates a first variation of the two-stage energy harvesting device of FIG. 4.
Figure 4C:
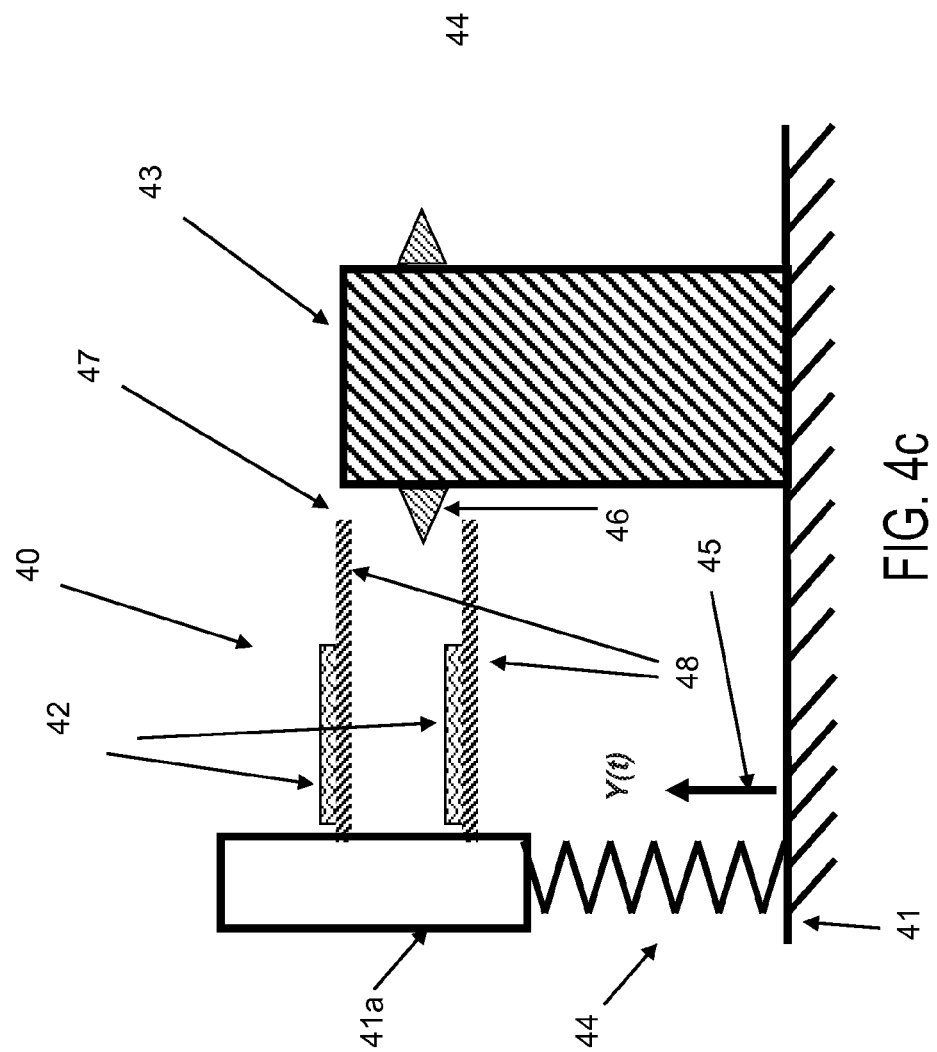
FIG. 4c illustrates a second variation of the two-stage energy harvesting device of FIG. 4.

Although the mass 43 and tip 46 shown in FIG. 4 is associated with one set of secondary vibratory systems 40, such secondary vibratory systems 40 can also be used on the right side of the Figure to engage tip 46 on the right side of mass 43. Furthermore, the tips 46 can be placed around a circumference of the mass and each have secondary vibratory systems 40 associated therewith. Still further, the mass 43 can be elongated in the direction of arrow Y(t) and have more than one row of tips 46, each row of tips 46 engaging secondary vibratory systems 40, as shown in FIG. 4a where like features are referred to with like reference numerals. The mass in FIG. 4a being referred to with reference numeral 43a and having two rows of tips 46 and the right side secondary vibratory systems 40 are not shown for clarity. Furthermore, each tip 43 can engage a top and bottom secondary vibratory system 40 as shown in FIG. 4 or, as shown in FIG. 4a, the center secondary vibratory system can be common to the lower 46 and upper tips 46a. FIG. 4b illustrates a top view (with the topmost secondary vibratory systems 40 removed for clarity). Although shown and described with regard to the mass 43 being vibrated, the structure 41a supporting the secondary vibratory systems 40 can vibrate while the mass 43 is fixed to the structure 41 (or both mass and secondary vibratory systems 40 can be free to vibrate).

In yet another embodiment, two-stage generators are provided for generating electrical energy by harvesting mechanical energy from rotary machinery such as windmills or turbines used to harvest tidal or ocean waves or other similar flows, in which the input rotary speed is relatively low and varies significantly over time and may even reverse itself, thereby making the use of all currently available electrical energy generators highly inefficient.

The schematic of a basic embodiment 50 of such a two-stage generator design for harvesting energy from slow and varying rotary motion is shown in FIG. 5. The generator consists of an outer housing 51, which is fixed, for example to a fixed structure 52. Internal to the housing is mounted at least one and preferably more secondary vibrating elements 55. In the schematic of FIG. 5, the secondary vibrating elements 55 are constructed as vibrating beam elements 56, over the surface of which certain active materials based mechanical to electrical energy transforming elements 57, such as bimorph piezoelectric elements, are mounted. The input is the rotating (or oscillating) shaft 53, to which at least one exciter tooth 54 is mounted. The shaft 53 is shown without bearing and support elements known in the art for the sake of clarity. The generator can operate as follows.

As the input shaft 53 rotates or oscillates rotationally, the exciter teeth 54 engage the tip 58 of the secondary vibrating elements 55, thereby transferring mechanical energy to the secondary vibrating elements 55. The secondary vibrating elements will then begin to vibrate, thereby generating charges on the mechanical to electrical energy conversion elements 57 that are then harvested by an appropriate electronics circuitry (not shown) and direct for use by certain load or for storage in appropriate electrical energy storage devices such as capacitors and/or rechargeable batteries.

One major source of loss in the generator of the embodiment of FIG. 5 is the mechanical interface where the exciter (s) 54 contact the tip 58 of the secondary vibrating elements 55. One solution to eliminate these losses is the use of magnets in the excitation interface as described previously for the embodiments of FIGS. 3 and 4, noting that to increase the efficiency of transferring mechanical energy from the shaft 53 (i.e., the primary stage) to the secondary vibrating elements, the magnets are desired to be positioned as close to each other as possible as the exciter(s) 54 pass the magnets fixed to the tip 58 of the secondary vibrating element 55. The term "engage" as used herein includes both contacting interaction and magnetic interaction of the exciters 54 and the secondary vibratory elements 55.

It is appreciated by those familiar with the art that secondary vibrating elements of various types may be used instead of vibrating beams used in the above embodiments. For example, the secondary vibratory element may be mass-spring elements (similar to the mass-spring 10 shown in FIG. 1) that are attached to the housing 51 with the mass element facing the shaft 53, and are pushed away in the radial direction by the (preferably rounded) exciter teeth 54 as the shaft rotates. Alternatively, the secondary vibrating element may be configured to vibrate rotationally, in which mode it is similarly excited by the exciter teeth 54. Such and other similar alternative secondary vibrating elements are well known in the art. Furthermore, the shaft 53 or housing 51 carry the secondary vibratory elements 55 and may rotate with the other of the shaft 53 or housing 51 may be fixed and carry the exciters 54.

As it was indicated earlier, one major source of energy loss in devices such as the embodiments of FIGS. 3-5 is the mechanical interface between the aforementioned primary system and the secondary vibratory system. To eliminate such contact losses, non-contacting magnet elements can be employed, preferably on both sides of the mechanical interfacing elements on the primary as well on the secondary vibratory systems. A number of arrangements may be formed to achieve the mechanical interfacing between the primary and secondary vibratory systems, hereinafter referred to generally as "permanent magnet interfaces", examples of such embodiments are described below. In the following, the disclosed permanent magnet interface embodiments are described as, for example, being applied to the rotary embodiment 50 of FIG. 5 to provide the aforementioned mechanical interface between the "exciter" tip 54 of the primary system and the tips 58 of the secondary vibratory members 55 (shown with the dash-lined circle "A" in FIG. 5).

Consider the exciter 54 of the rotary generator of the embodiment 50 of FIG. 5. The following permanent magnet based embodiments are intended to be used in place of the exciter tip 54 and the tip 58 of the secondary vibrating elements 55 to eliminate the physical contact and their related wear and energy losses. In these embodiments, various attractive or repulsive magnetic arrangements are used for discontinuously interfacing the aforementioned primary and secondary systems to transfer mechanical energy from the primary system to the said secondary (vibratory) system.

Figure 6:
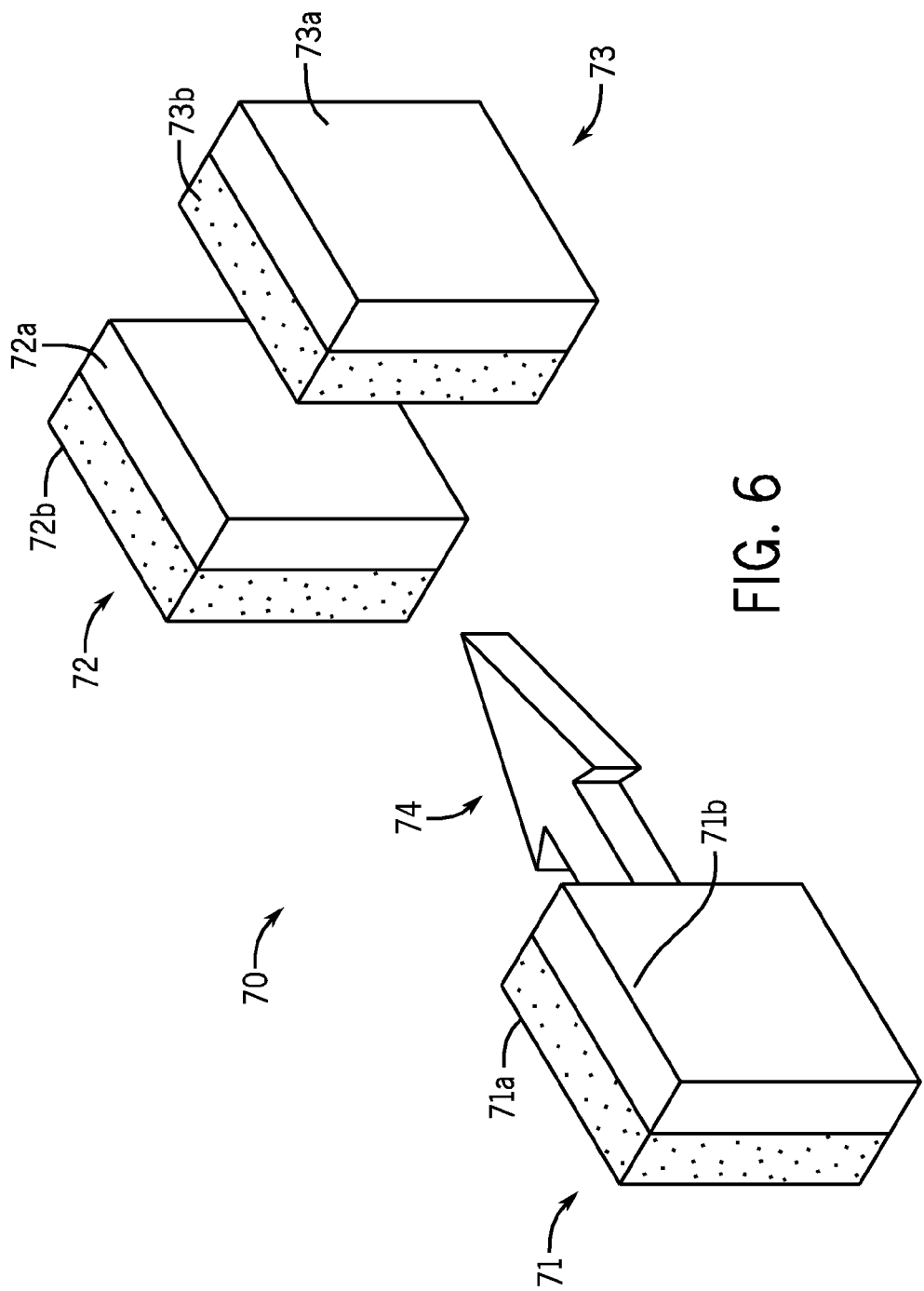
FIG. 6 illustrates a schematic of a first embodiment of magnet based interfacing between the primary and secondary systems to transfer mechanical energy from the primary system to the secondary vibratory system.

The first embodiment 60 of the permanent magnet interfaces, hereinafter called "three magnet repulsive permanent magnet interfaces" is shown in the schematic of FIG. 6. In this embodiment, three permanent magnets 61, 62 and 63 are used. The permanent magnet 61 is attached to the exciter element of the primary system (tip of the exciter 54 for the case of the embodiment 50 of FIG. 5), and the pair of spaced apart permanent magnets 62 and 63 are attached to the secondary vibratory member (tip of the vibratory members 55 for the case of the embodiment 50 of FIG. 5). It is appreciated by those skilled in the art that alternatively, the permanent magnet 61 may be attached to the secondary vibrating members while the pair of permanent magnets 62 and 63 are attached to the exciter element of the primary system. In the schematic of FIG. 6, reference numerals 61a, 62a and 63a of the permanent magnets 61, 62 and 63, respectively, are intended to indicate the north-pole (N) of the permanent magnet and the opposite side, the south-pole (S) of the permanent magnet, is indicated by reference numerals 61b, 62b and 63b. Consistent with such nomenclature, in subsequent Figures, "a" is used to denote a north-pole of a magnet and "b" is used to denote a south-pole. The configuration of FIG. 6 provides the aforementioned interfacing between the primary and secondary systems to transfer mechanical energy from the primary system to the said secondary (vibratory) system, and when using the same permanent magnets and with their similar relative positioning, they provide for maximum mechanical energy transfer to the secondary vibratory system.

In the embodiment 60 of FIG. 6, at least one magnet 60 is attached to the primary system which moves at a low and variable speed. The primary system magnet 61 is positioned to travel in the direction of the arrow 64 during the motion of the primary system (for the embodiment 50 of FIG. 5, the tip 54 of the rotating primary system 53) and pass between two other sets of at least one magnet 62 and 63, which are attached to the secondary (vibratory) system (for the embodiment 50 of FIG. 5, the tip 58 of the secondary vibratory systems consisting of the bending beams 55). The magnets 62 and 63 are arranged such that like poles are adjacent as the primary system magnet 61 moves between the secondary system magnets 62 and 63 as shown in FIG. 6. As the primary system magnet 61 approaches the two magnets 62 and 63, the repulsive forces drive the secondary system away from the primary system until either: The secondary system cantilever beam deflects over the primary system magnet 61, or the deflection force of the secondary system overcomes the repulsive force of the magnets and the secondary system slips past the point of maximum repulsion and is thus propelled to the trailing side of the primary system. This arrangement would see an increase in performance if the path of the primary system were tailored to meet the deflection path (for the embodiment 50 of FIG. 5, the bending curvature for the secondary vibratory systems consisting of the bending beams 55) of the engaging end of the secondary system (for the embodiment 50 of FIG. 5, the tip 58 of the beam elements 55).

Figure 7:
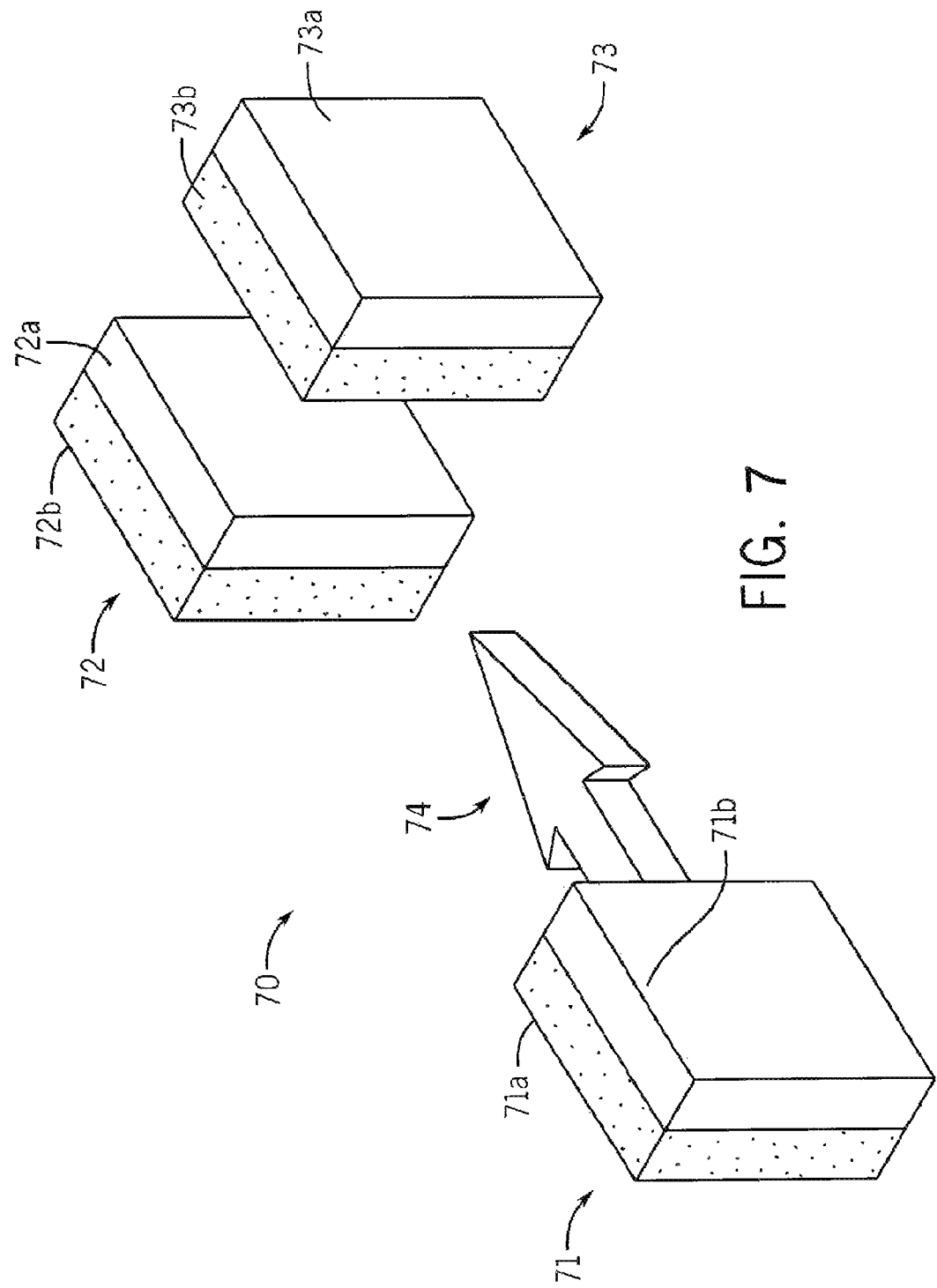
FIG. 7 illustrates a schematic of a second embodiment of magnet based interfacing between the primary and secondary systems to transfer mechanical energy from the primary system to the secondary vibratory system.

The second embodiment 70 of the permanent magnet interfaces, hereinafter called "three magnet attractive permanent magnet interfaces" is shown in the schematic of FIG. 7. In this arrangement, the primary system magnet 71 is positioned to travel in the direction of the arrow 74 during the motion of the primary system (for the embodiment 50 of FIG. 5, the tip 54 of the rotating primary system 53) and pass between two other sets of at least one magnet 72 and 73, which are attached to the secondary (vibratory) system (for the embodiment 50 of FIG. 5, the tip 58 of the secondary vibratory systems consisting of the bending beams 55). This magnet arrangement is similar to the three-magnet-repulsive of the embodiment 60 of FIG. 6, except that during the pass-through of the primary system magnet 71 (in the direction of the arrow 74), opposite poles are adjacent and the resulting forces are attractive between the primary system magnet 71 and the secondary system magnets 72 and 73. This arrangement generally allows for significant excitation of the secondary vibratory system even if the primary system magnet 71 does not pass by the secondary system magnets 72 and 73 due to limited primary system range of motion. If the primary system magnet 71 cannot break the maximum attraction to the secondary system magnets 72 and 73, the forces during some subsequent cycle (which are strong enough to break the attraction) will excite the system regardless of the direction of motion of the primary system magnet.

This arrangement however, has certain disadvantages compared to the three-magnet-repulsive arrangement of the embodiment 60 of FIG. 6. Firstly, for the same system parameters (magnet strength, system geometry, etc) the input to the secondary system of the three-magnet-repulsive arrangement is lower as compared to the embodiment 60 of FIG. 6, owing to the toggle-behavior of the magnetic forces in the three-magnet-repulsive systems. In the three-magnet-attractive system, after the primary system magnet 71 passes through the two secondary system magnets 72 and 74, the forces curtail the excitation of the secondary system by attracting the secondary system magnets 72 and 73 back toward the primary system magnet 71. Secondly, instabilities induced in the system which may cause lateral deformation to either of the magnet holding fixtures will lead to contact of the magnets during the excitation. This problem does not occur in the three-magnet-repulsive system because as can be observed in the schematic of the embodiment 60 of FIG. 6, in the potential energy of the interaction between the magnets, there is at a minimum when the center magnet (61) is equidistant between the two adjacent like poles (of the magnets 62 and 63).

Figure 8:
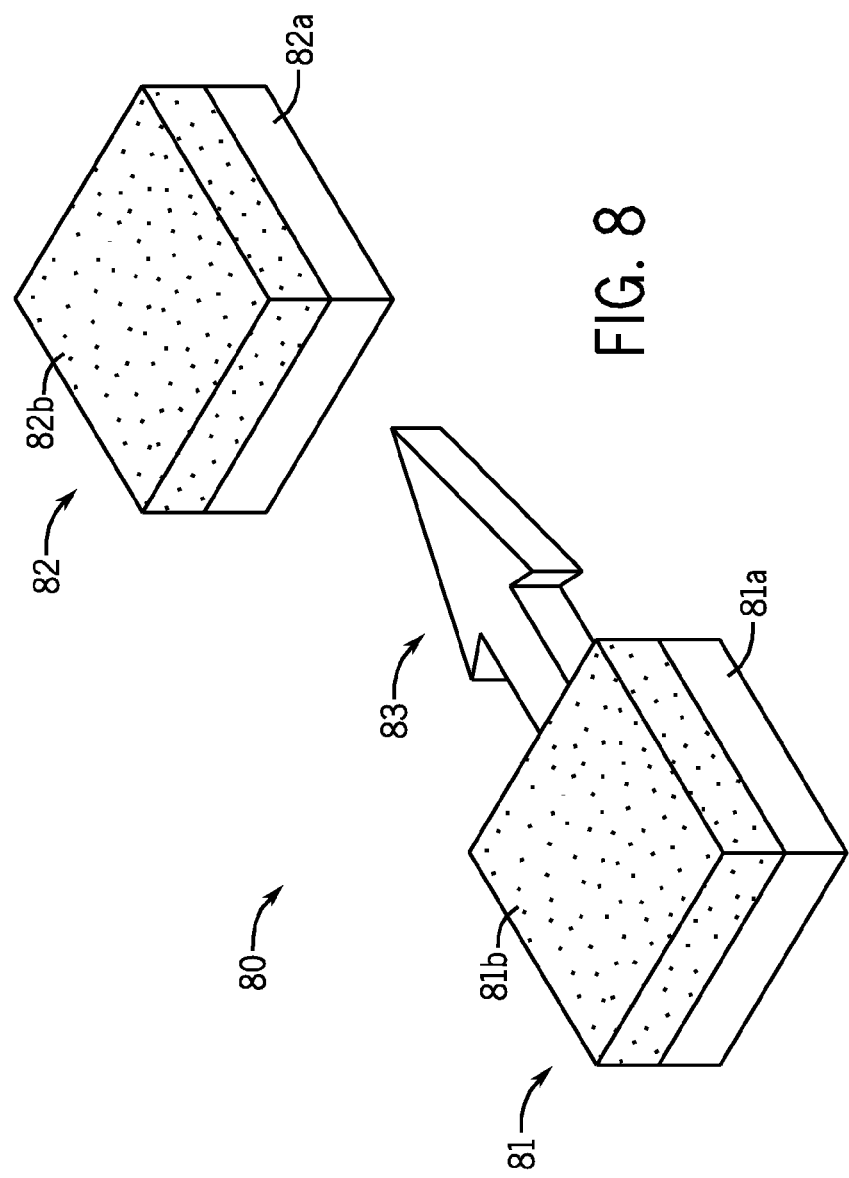
FIG. 8 illustrates a schematic of a third embodiment of magnet based interfacing between the primary and secondary systems to transfer mechanical energy from the primary system to the secondary vibratory system.

The third embodiment 80 of the permanent magnet interfaces, hereinafter called "two magnet attractive permanent magnet interfaces" is shown in the schematic of FIG. 8. In this arrangement, at least the magnet 81 of the primary system is positioned to travel in the direction of the arrow 83 during the motion of the primary system (for the embodiment 50 of FIG. 5, the tip 54 of the rotating primary system 53) and pass over at least one magnet 82, which is attached to the secondary (vibratory) system (for the embodiment 50 of FIG. 5, the tip 58 of the secondary vibratory systems consisting of the bending beams 55). This arrangement of the magnets 81 and 82 offers similar interaction to the three-magnet-attractive arrangement of the embodiment 70 of FIG. 7, but generally provides lower interaction force (i.e., mechanical energy transfer) but has the advantage that there is no possibility that the magnets 81 and 82 coming into contact.

Figure 9:
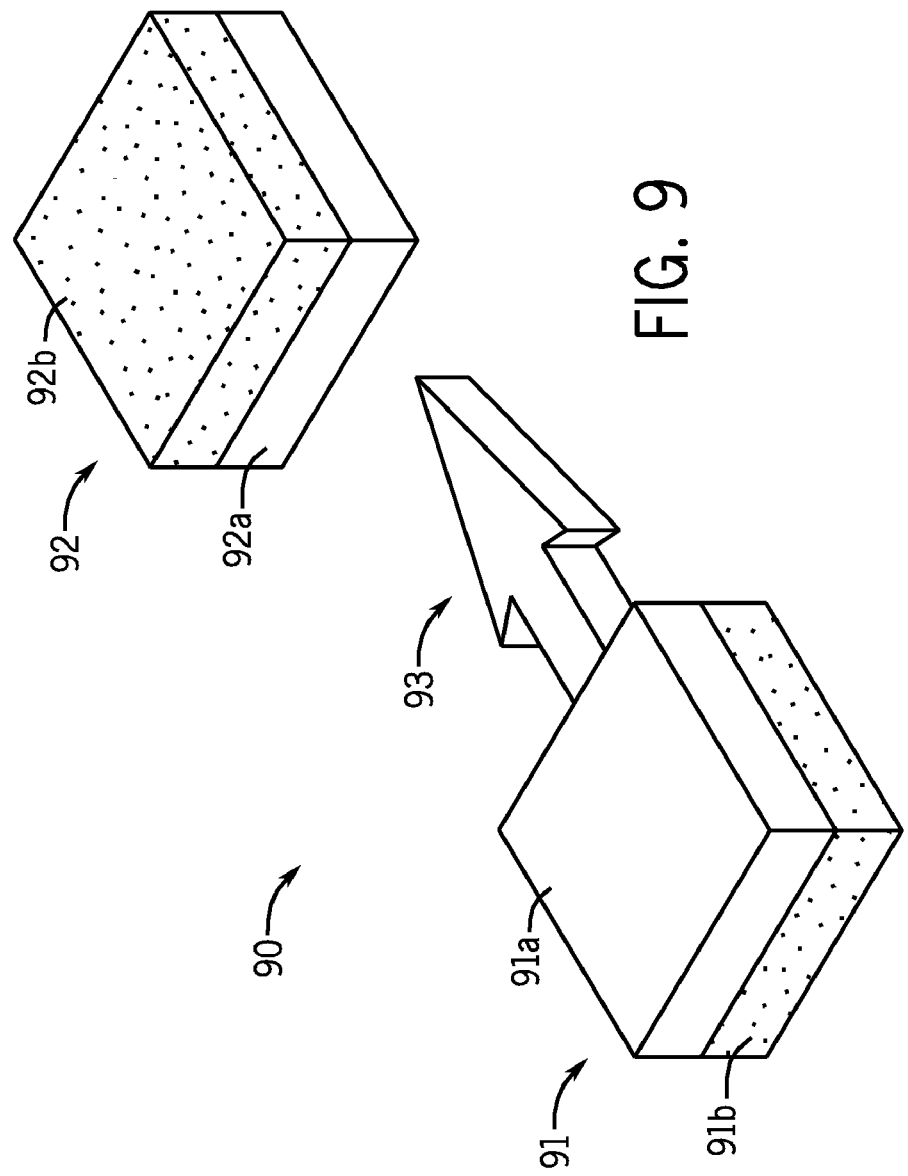
FIG. 9 illustrates a schematic of a fourth embodiment of magnet based interfacing between the primary and secondary systems to transfer mechanical energy from the primary system to the secondary vibratory system.

The fourth embodiment 90 of the permanent magnet interfaces, hereinafter called "two magnet repulsive permanent magnet interfaces" is shown in the schematic of FIG. 9. In this arrangement, at least the magnet 91 of the primary system is positioned to travel in the direction of the arrow 93 during the motion of the primary system (for the embodiment 50 of FIG. 5, the tip 54 of the rotating primary system 53) and pass over at least one magnet 92, which is attached to the secondary (vibratory) system (for the embodiment 50 of FIG. 5, the tip 58 of the secondary vibratory systems consisting of the bending beams 55). This arrangement of the magnets 91 and 92 offers similar interaction to the three-magnet-repulsive arrangement of the embodiment 60 of FIG. 6, but generally provides lower interaction force (i.e., mechanical energy transfer) but has the advantage that there is no possibility that the magnets 81 and 82 coming into contact.

Figure 10:
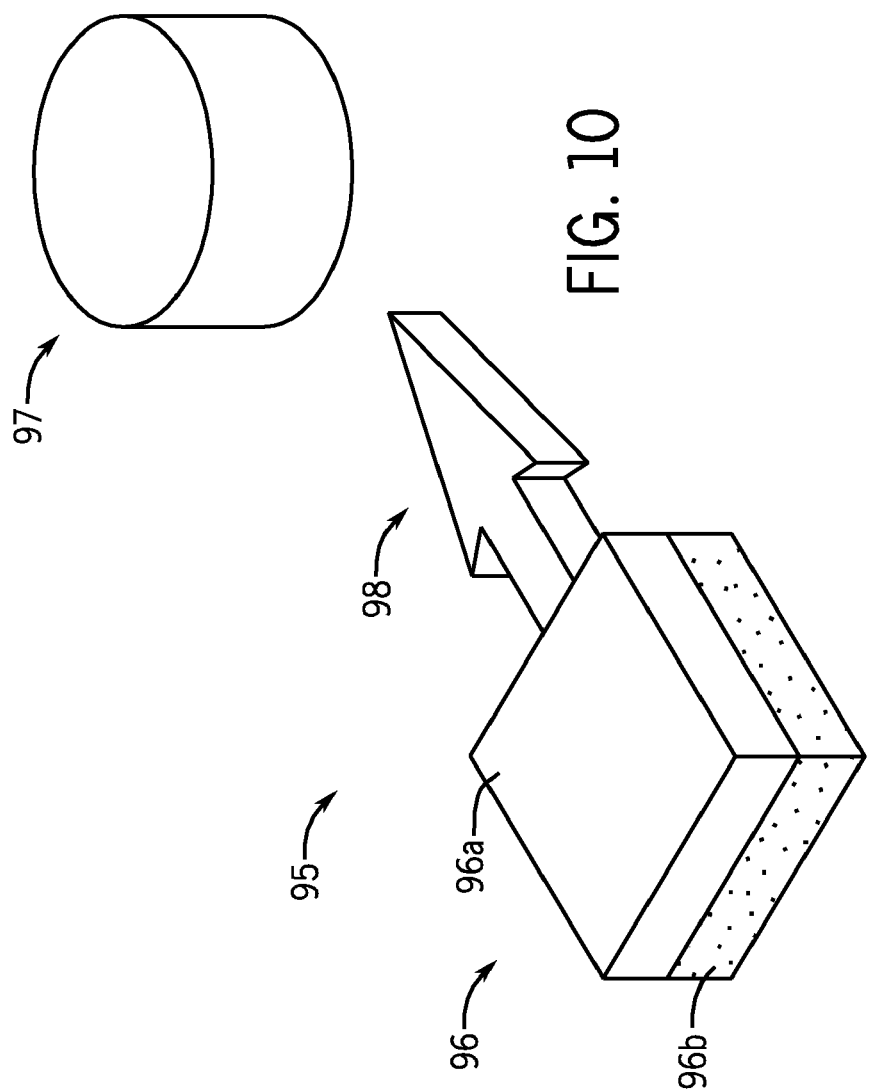
FIG. 10 illustrates a schematic of a fifth embodiment of magnet based interfacing between the primary and secondary systems to transfer mechanical energy from the primary system to the secondary vibratory system.

The fifth embodiment 95 of the permanent magnet interfaces, hereinafter called "one magnet and one iron slug interfaces" is shown in the schematic of FIG. 10. In this arrangement, at least the magnet 96 is fixed to the primary system and positioned to travel in the direction of the arrow 98 during the motion of the primary system (for the embodiment 50 of FIG. 5, the tip 54 of the rotating primary system 53) and pass over at least one iron slug 97, which is attached to the secondary (vibratory) system (for the embodiment 50 of FIG. 5, the tip 58 of the secondary vibratory systems consisting of the bending beams 55). This arrangement of the magnet 96 and iron slug 97 offers similar attractive interaction described above for the embodiment 80 of FIG. 8, but generally provides lower interaction force (i.e., mechanical energy transfer) but still has the advantage that there is no possibility of the magnet 96 and the iron slug 97 coming into contact.

Although described with regard to the device of FIG. 5, the above configurations illustrated in FIGS. 6-10 can be used with any of the embodiments described herein.

In the embodiments of FIGS. 3-5, bending elements are used to form the aforementioned secondary vibratory systems. It is appreciated by those skilled in the art that alternative secondary vibratory systems may be configured to vibrate rotationally (or in fact undergo any oscillatory motion, including linear oscillation). In such systems, including in rotationally vibrating secondary vibratory systems, the secondary system can be excited by the primary system via one of the aforementioned interfacing embodiments, such as the embodiments of FIGS. 6-10. The secondary vibratory systems that are designed for rotational vibration (oscillations) are suitable for magnet and coil type of mechanical to electrical energy conversion devices (generators). Such magnet and coil generators are well known in the art, particularly the dynamo type of rotary magnet and coil generators are widely used and may be readily designed to efficiently generate electrical energy while undergoing rotary oscillations. Magnet and coil generators designed to similarly generate electrical energy by linear vibratory (oscillatory) motion are less common but known in the art and are described, for example, in the U.S. Pat. Nos. 7,586,220, 7,554,224 and 6,952,060, the contents of each of which are incorporated herein by reference.

Figure 11:
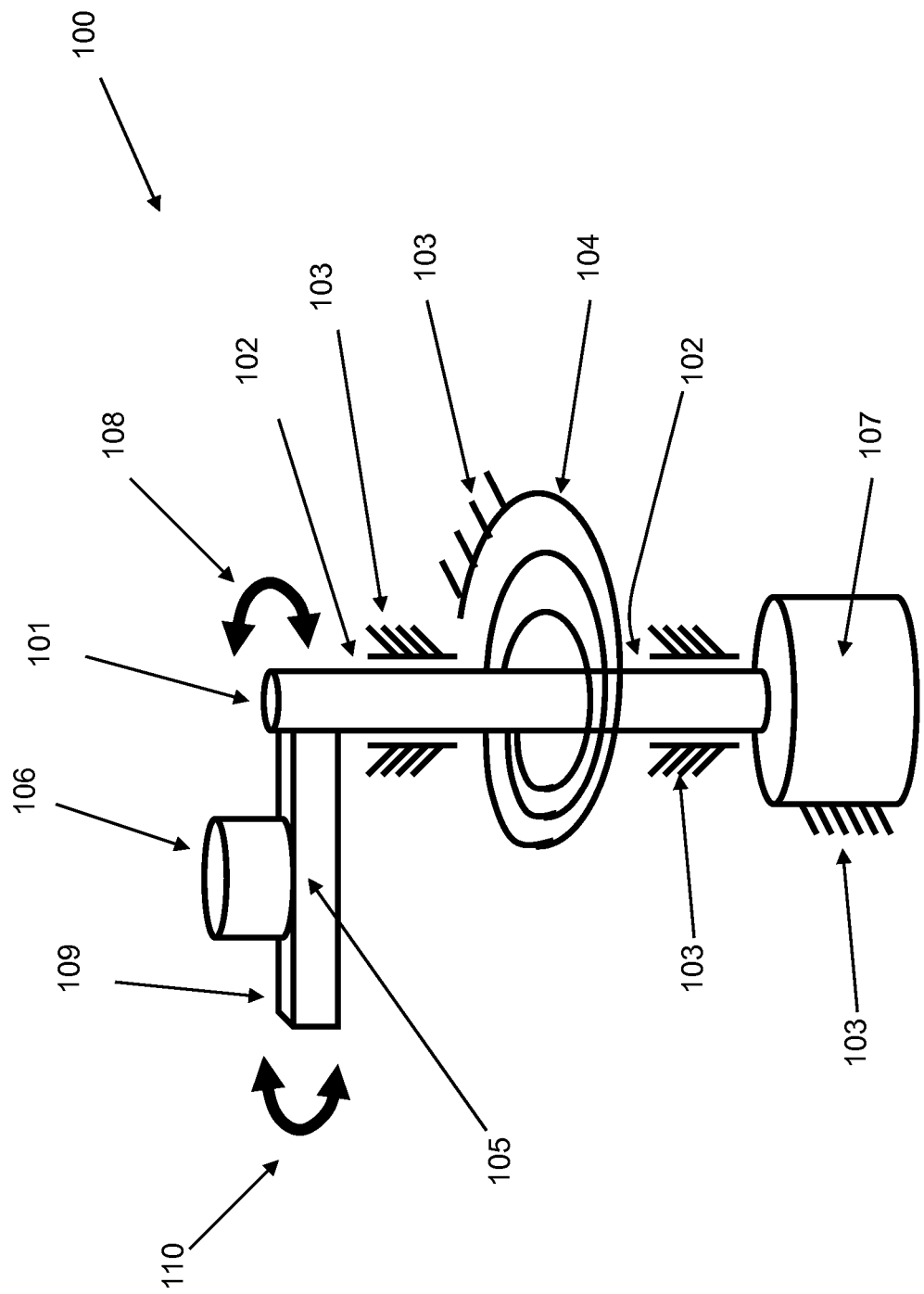
FIG. 11 illustrates an embodiment of the secondary vibratory system of the two-stage energy harvesting device that utilizes a rotary magnet and coil generator for converting mechanical energy of rotational vibration to electrical energy.

An embodiment of a secondary vibratory system that undergoes rotary oscillations (vibration) and is designed to be excited by the aforementioned primary system is shown in the schematic of FIG. 11. This embodiment 100 of the secondary vibratory system consists of a shaft 101, which is mounted in the bearings 102, which are fixed to the structure 103 of the overall system (here shown as being grounded). One end of the shaft is attached to the input shaft of a rotary magnet and coil type generator 107, the outer housing of which is also fixed to the structure 103 of the overall system. A torsion spring 104 is also provided, which is attached to the shaft 101 on one end and to the fixed structure 103 on the other end and is configured as shown in FIG. 11 to generate a torque that counters the rotational motion of the shaft with a selected spring rate. A relatively rigid link 105 is also fixed to the shaft 101. A mass element 106, which is attached to the link 105 at a certain distance from the axis of rotation of the shaft 101, may also be provided to achieve the desired moment of inertia for the shaft 101, link 105 and the mass element 106 assembly about the axis of rotation of the shaft 101 (other components such as the torsion spring 104 and the rotor of the generator 107 described below may also contribute to the moment of inertia and must be considered). The assembled system would thereby vibrate (oscillate) rotationally as shown by the arrow 108 if provided with an initial rotational displacement (or velocity).

The magnet and coil rotary generator 107 is also attached to the shaft 101 either directly or via rotational angle increasing mechanisms such as appropriate gearing or linkage mechanisms. Here, the primary system (for example, for the embodiment 50 of FIG. 5, the tip 54 of the rotating primary system 53) is intended to interface with the tip 109 of the secondary vibratory system 100 (for the embodiment 50 of FIG. 5, the tip 58 of the secondary vibratory systems consisting of the bending beams 55), such as with one of the aforementioned interfacing embodiments of FIGS. 6-10. With such an interfacing between the aforementioned primary system (not shown) and the secondary vibratory system 100, the primary system will intermittently engage the interfacing element attached to the tip 109 of the secondary vibratory system 100, rotate the link 105 and thereby the shaft 101 a certain amount from its neutral and stationary position and then release it, thereby allowing secondary vibratory system 100 to vibrate rotationally in the direction of the arrow 110. The magnet and coil rotary generator 107 would then transform the stored mechanical energy in the secondary vibratory system 100 to electrical energy. It is appreciated by those skilled in the art that the efficiency of the mechanical energy to electrical energy conversion is dependent on the efficiency of the magnet and coil generator 107 and the level of frictional and damping losses in the various components of the secondary vibratory system 100.

Figure 12:
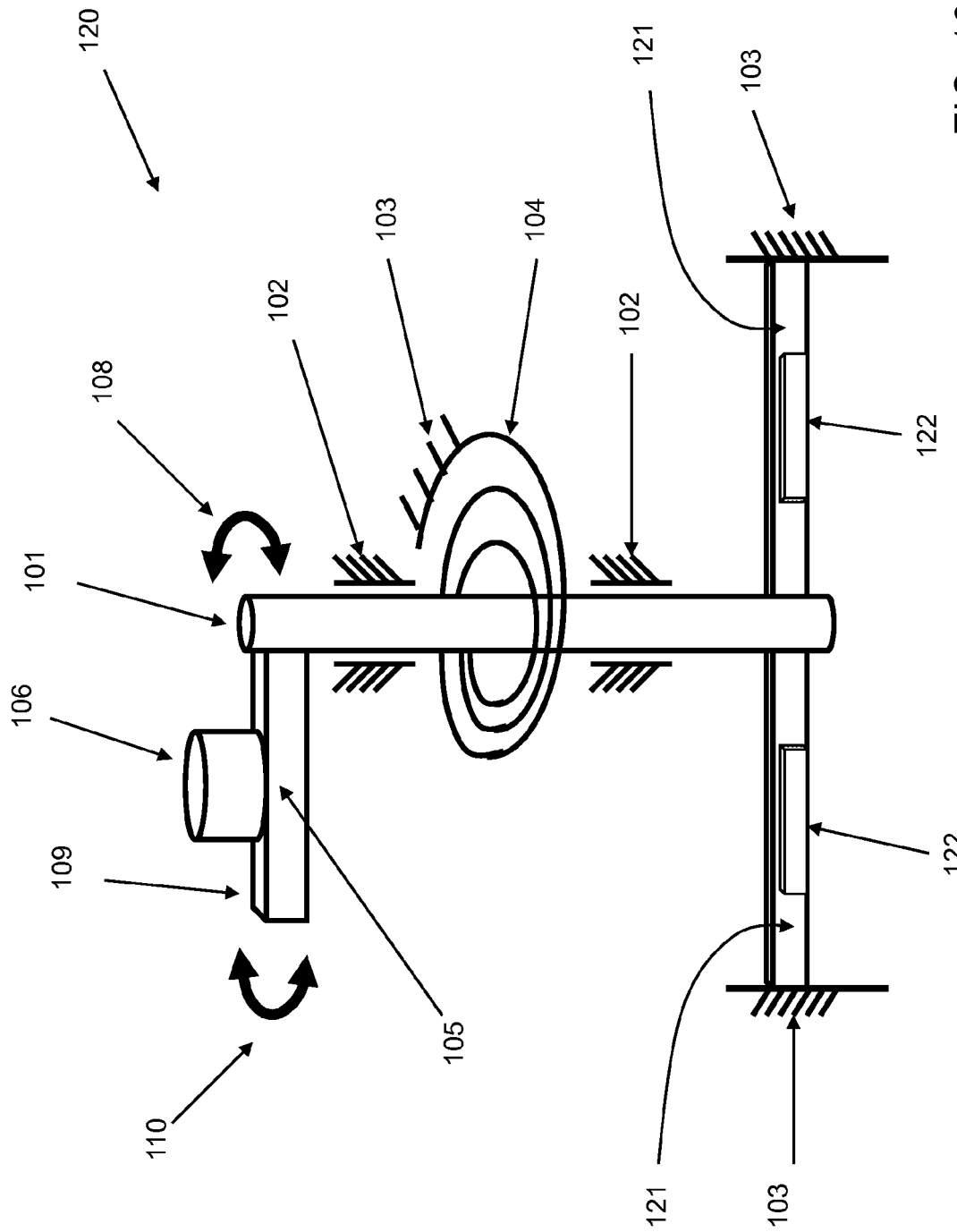
FIG. 12 illustrates an embodiment of the secondary vibratory system of the two-stage energy harvesting device that utilizes piezoelectric elements for converting mechanical energy of rotational vibration to electrical energy.

In an alternative embodiment 120 shown in the schematic of FIG. 12, instead of the magnet and coil rotary generator 107 of the embodiment 100 of FIG. 11, piezoelectric elements are used to convert mechanical energy of rotational vibration of the secondary vibratory system 120 to electrical energy. In the embodiment 120, except the generator 107, all other components of the embodiment are identical to those of the embodiment 100 of FIG. 11. In the embodiment 120, at least one flexible beam 121 is attached to the shaft 101 on one end and to the structure 103 of the overall system. The flexible beam may be constructed with curvature to make it more flexible and less resistant to bending. Piezoelectric elements 122 are attached to the surface of the flexible beams such that as the flexible beams are bent, they are subjected to either tensile or compressive stresses depending on the direction of the applied bending, thereby providing the means of converting mechanical energy into electrical energy. Now as the shaft 101 oscillates in rotation following engagement with the primary system as was described above for the embodiment 100 of FIG. 11, the flexible beam is deflected in bending, and mechanical energy of rotational vibration of the secondary vibratory system 120 can be converted into electrical energy.

It is appreciated by those skilled in the art that the flexible beam 121 of the embodiment 120 of FIG. 12 itself may be constructed fully or partially with piezoelectric materials for the purpose of converting mechanical energy of rotational vibration of the secondary vibratory system 120 can be converted into electrical energy. In addition, the effective spring rate of the flexible beam elements 121 may be designed to correspond to the desired spring rate of the torsion spring element 104, thereby eliminating the need for the torsion spring element 104.

Figure 13:
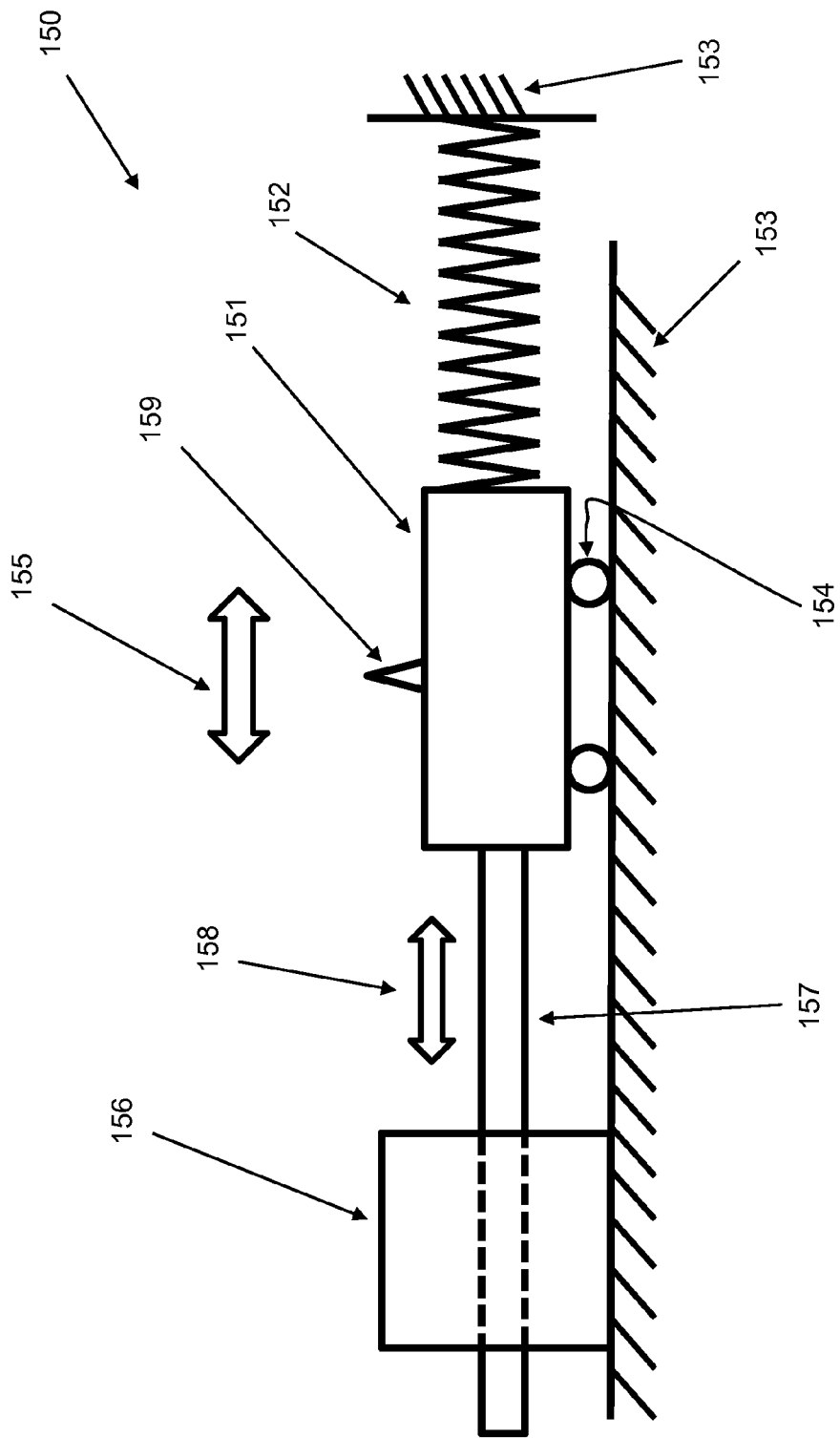
FIG. 13 illustrates an embodiment of the secondary vibratory system of the two-stage energy harvesting device that utilizes a linear magnet and coil generator for converting mechanical energy of translational vibration to electrical energy.

As it was previously indicated, the secondary vibratory system may be designed to utilize linear magnet and coil generators to generate electrical energy by linear vibratory (oscillatory) motion. The linear oscillatory motion input to the linear magnet and coil generator, for example of the types disclosed in the aforementioned patents, may be generated by, e.g., a simple mass-spring system that is excited by the primary system to intermittently undergo linear oscillatory motions. The schematic of such an embodiment 150 is shown in FIG. 13. The vibratory (mass-spring) unit of the embodiment 150 consists of a mass 151 and a spring (elastic) element 152. The mass element 151 is free to travel on the surface of the structure of the overall system 153 (in the schematic of FIG. 13 the resulting sliding joint is indicated by the rolling elements 154). The spring element 152 is attached to the mass element 151 on one end and to the structure of the overall system 153 on the other end. The assembly of the mass element 151 and spring element 152, when excited (i.e., provided with an initial translation from its neutral—stationary-position), would begin to undergo an oscillatory translation in the direction of the arrow 155. A linear magnet and coil generator 156 is attached to the mass element 151 via the input shaft 157 of the generator 156. Then, as the input shaft 157 is forced by the mass element 151 to translate back and forth in the direction of the arrow 158 as the mass element 151 and spring element 152 oscillate in the direction of the arrow 155, the linear magnet and coil generator 156 convert the mechanical energy of vibration of the mass-spring unit into electrical energy.

Here, the primary system (for example, for the embodiment 50 of FIG. 5, the tip 54 of the rotating primary system 53) is intended to interface with the interfacing component 159 of the secondary vibratory system 150 (for the embodiment 50 of FIG. 5, the tip 58 of the secondary vibratory systems consisting of the bending beams 55), such as by using one of the aforementioned interfacing embodiments of FIGS. 6-10. With such an interfacing between the aforementioned primary system (not shown) and the secondary vibratory system 150, the primary system will intermittently engage the interfacing element attached to the mass element 151 (shown as the component 159) of the secondary vibratory system 150, translate the mass element 151 in one of the directions of the arrow 155 from its (preferably) neutral and stationary position and then releases it, thereby causing the secondary vibratory system 150 to vibrate (i.e., oscillate linearly in the direction of the arrow 155). The shaft 157 of the linear magnet and coil generator 156 would then translate back and forth in the direction of the arrow 158, thereby causing the mechanical energy stored in the secondary vibratory system 150 to be transformed into electrical energy. It is appreciated by those skilled in the art that the efficiency of the mechanical energy to electrical energy conversion is dependent on the efficiency of the magnet and coil generator 156 and the level of frictional and damping losses in the various components of the secondary vibratory system 150.

In the embodiment 150 of FIG. 13, a linearly vibrating mass-spring system is used to provide input motion to the linear magnet and coil generator. It is, however, appreciated by those skilled in the art that the linear input motion may be provided using various types of linkage mechanisms that are coupled to other vibratory systems undergoing linear or rotary or other types of oscillatory motions.

Figure 14:
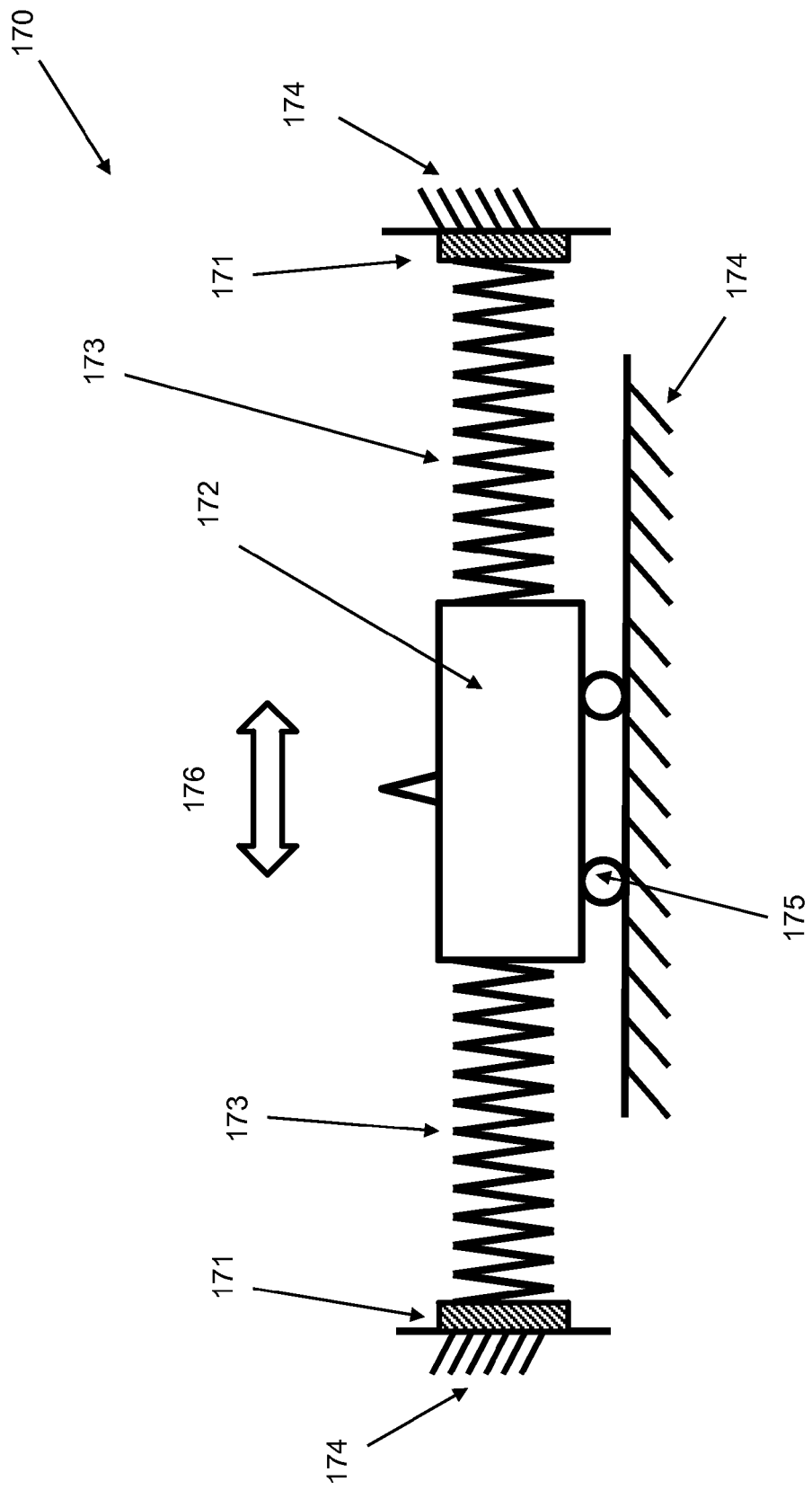
FIG. 14 illustrates an embodiment of the secondary vibratory system of the two-stage energy harvesting device that utilizes piezoelectric generator for converting mechanical energy of translational vibration to electrical energy.

In an alternative embodiment 170 shown in the schematic of FIG. 14, at least one piezoelectric 171 is used for mechanical energy to electrical energy conversion in place of the linear magnet and coil generator 156 of the embodiment 150 of FIG. 13. In the embodiment 170, a similar mass element 172 and at least one spring 173 are used to form the vibrating unit of the secondary vibratory system 170. The mass element 172 is free to travel on the surface of the structure of the overall system 174 (in the schematic of FIG. 14 the resulting sliding joint is indicated by the rolling elements 175). The springs 173 are connected to the mass element 172 on one end and to the structure 174 of the overall system on the other end, with at least one piezoelectric element 171 positioned between at least one of the spring elements and the structure 174 of the overall system. Then, when the mass 172 and spring 173 system is excited intermittently by the primary system as was described for the embodiment 150 of FIG. 13, the mass element 172 translates (oscillates) back and forth in the direction of the arrow 176, causing the springs 173 to deform and apply varying force on the piezoelectric elements 171, thereby causing the piezoelectric elements 171 to convert the mechanical energy of vibration of the mass-spring system of the secondary vibratory system 170 into electrical energy. Here, the interfacing between the primary system (not shown) and the secondary vibratory system may be the same as that described above for the embodiment 150 of FIG. 13.

In all the aforementioned embodiments of the present invention, the primary system intermittently transfers mechanical energy to secondary vibratory systems. The mechanical energy of vibration is then harvested using mechanical to electrical energy conversion devices such as piezoelectric or magnet and coil generators as the secondary vibratory systems undergo vibratory (oscillatory) linear, rotary, bending, etc., motions. It is, however, appreciated by those skilled in the art that the secondary system may be designed for continuous rotation instead of vibratory motion. Such secondary systems may be advantageous in certain applications, particularly if a relatively large amount of mechanical energy is transferred each time from the primary system to allow the continuously rotating secondary system to achieve high enough rotational speed to make it possible to efficiently transform the transferred mechanical energy to electrical energy. Numerous designs are possible for such continuously rotating secondary systems, examples of which are provided as the following two embodiments.

Figure 15:
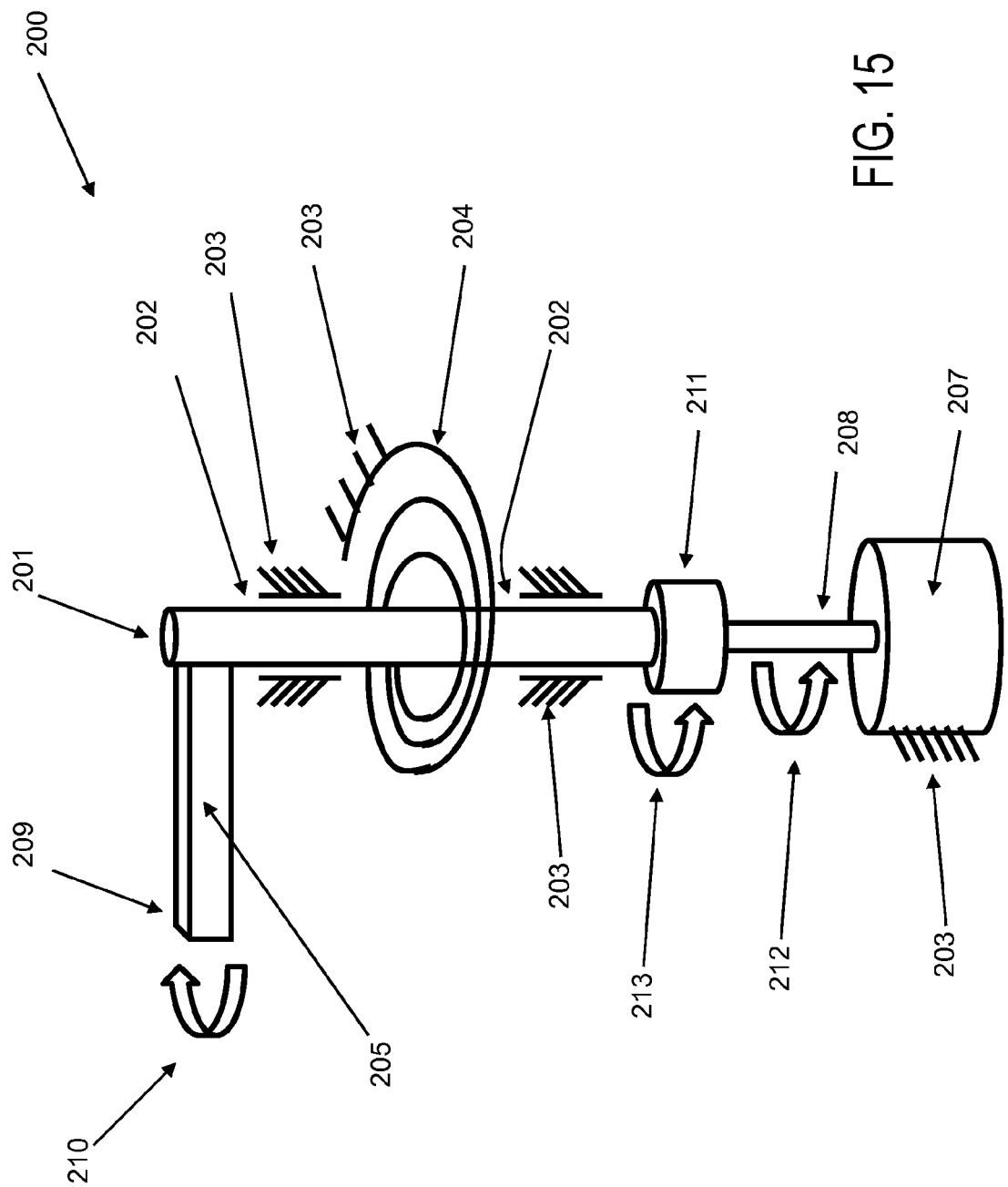
FIG. 15 illustrates a first embodiment of a continuously rotating secondary system of the two-stage energy harvesting device that utilizes a rotary magnet and coil generator for converting mechanical energy intermittently transferred from the primary system to electrical energy.

A first embodiment 200 of a continuously rotating secondary system that is designed to intermittently receive mechanical energy from the aforementioned primary system (not shown) is shown in the schematic of FIG. 15. This embodiment 200 of the continuously rotating secondary system consists of a shaft 201, which is mounted in the bearings 202, which are fixed to the structure 203 of the overall system (here shown as being grounded). A torsion spring 204 is also provided, which is attached to the shaft 201 on one end and to the fixed structure 203 on the other end and is configured as shown in FIG. 15 to generate a torque that counters the rotational motion of the shaft proportional to the selected spring rate of the torsion spring 204. The shaft 208 of a magnet and coil rotary generator 207 is attached to the shaft 201 via a one-way clutch 211. The outer housing of the magnet and coil rotary generator 207 is fixed to the structure 203 of the overall system. The one-way clutch 211 is configured to allow free rotation of the shaft 208 of the magnet and coil rotary generator 207 in the direction of the arrow 212, i.e., if the shaft 201 is held fixed to the structure 203 of the overall system, the shaft 208 of the magnet and coil rotary generator 207 is still free to rotate in the direction of the arrow 212 but not in the direction opposite to the direction of the arrow 212 (in which case, the one-way clutch 211 "locks" together the shafts 208 and 201). The shaft 208 is attached either directly or preferably via rotational angle increasing mechanisms such as appropriate gearing or linkage mechanisms to the magnet and coil rotary generator 207.

A relatively rigid link 205 is also fixed to the shaft 201 as shown in FIG. 15. The primary system (for example, for the embodiment 50 of FIG. 5, the tip 54 of the rotating primary system 53) is intended to interface with the tip 209 of the secondary vibratory system 200 (for the embodiment 50 of FIG. 5, the tip 58 of the secondary vibratory systems consisting of the bending beams 55), such as by using one of the aforementioned interfacing embodiments of FIGS. 6-10. With such an interfacing between the aforementioned primary system (not shown) and the secondary system 200, the primary system will intermittently engage the interfacing element attached to the tip 209 of the secondary system 200, rotate the link 205 (in the schematic of FIG. 15 indicated by the direction of the arrow 210), and thereby rotate the shaft 201 certain amount from its (preferably) neutral and stationary position. As a result, a certain amount of mechanical potential energy is stored in the torsion spring element 204. It is noted that during the rotation of the shaft 201 in the direction of the arrow 210, the one-way clutch 211 does not transmit the said rotation of the shaft 201 to the shaft 208 of the magnet and coil rotary generator 207. Then once the aforementioned interfacing mechanism releases the link 205, the spring element 204 forces the shaft 201 to begin to rotate in the direction opposite to that of the arrow 210, thereby rotating the one-way clutch 211 in the direction of the arrow 213. As a result, one-way clutch 211 engages the shaft 208 of the magnet and coil rotary generator 207, and begin to accelerate the (moment of inertial) of the magnet and coil rotary generator 207. This process continues until the mechanical energy stored in the torsion spring 204 is transferred to the rotating mass (moment of inertial) of the magnet and coil rotary generator 207 in the form of kinetic energy. The one-way clutch 211 then disengages from the shaft 208 and allows the magnet and coil rotary generator 207 to continue to rotate in the direction of the arrow 212 until the said transferred kinetic energy is transformed to electrical energy.

Here it was assumed that the inertia of the shaft 201, link 205 and the torsion spring 204 and all frictional and damping forces are negligible. However, it is appreciated by those skilled in the art that the efficiency of the disclosed mechanical energy to electrical energy conversion is dependent on the efficiency of the magnet and coil generator 207 and the level of frictional and damping losses in the various components of the secondary system 200. The moment of inertia of the shaft 201, link 205 and the torsion spring 204 must also be minimized. In addition, if the amount of mechanical potential energy that can be stored in the torsion spring 204 is relatively large, then additional inertia element (wheel) may coupled to the rotating component of the magnet and coil generator 207.

Figure 16:
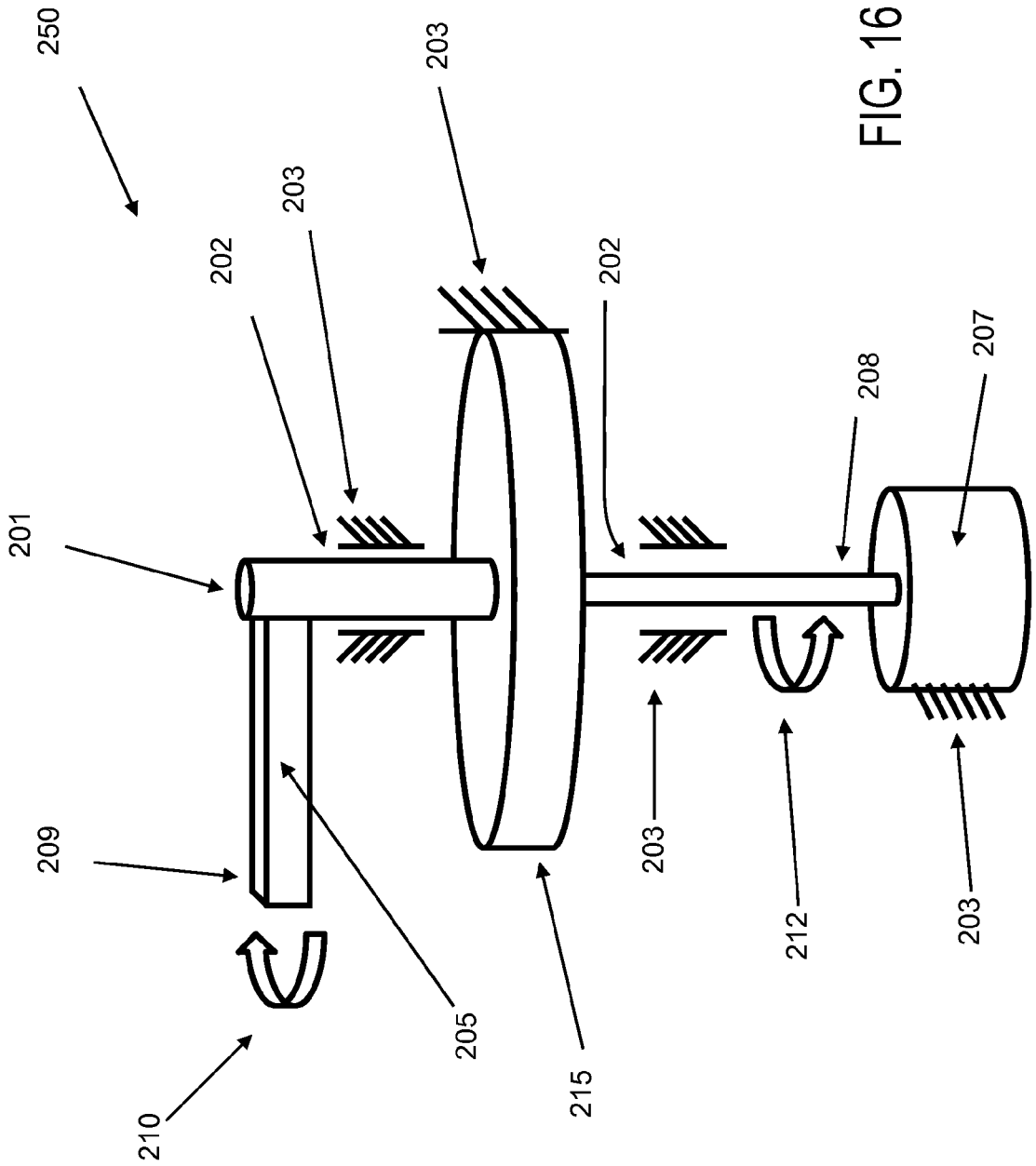
FIG. 16 illustrates a second embodiment of a continuously rotating secondary system of the two-stage energy harvesting device that utilizes a rotary magnet and coil generator for converting mechanical energy intermittently transferred from the primary system to electrical energy.

A second embodiment 250 of a continuously rotating secondary system that is designed to intermittently receive mechanical energy from the aforementioned primary system (not shown) is shown in the schematic of FIG. 16. This embodiment 250 of the continuously rotating secondary system is similar to the embodiment 200 of FIG. 15, with all its components being the same and enumerated as in the embodiment 200 except for the torsion spring 204, which is replaced with spring rewinding mechanism 215. In addition, there is generally no need for the one-way clutch 211, FIG. 15. Rewinding mechanisms are well known in the art and are used widely in toys, clocks and the like to store mechanical energy in the form of mechanical potential energy in torsion type springs using ratcheting mechanisms. In the embodiment 250, the shaft 201 is attached to the rewinding mechanism 215 and provides intermittent back and forth motion that would act through the ratcheting mechanism of the device to store mechanical energy in its torsion spring (not shown). The output shaft of the spring rewinding mechanism 215 is in turn attached to the input shaft 208 of the magnet and coil rotary generator 207. The spring winding in the component 215 is achieved by each rotation of the link 205 in the direction of the arrow 210 by the aforementioned interfacing mechanism with the primary system as was described for the embodiment 200 of FIG. 15 and the return of the link 205 to its starting position by a return spring (usually provided inside the spring rewinding mechanism 215). Then as the link 205 is rotated in the direction of the arrow 210, mechanical potential energy is stored in the spring winding mechanism 215. The stored mechanical potential energy is then transferred to the magnet and coil rotary generator 207, thereby allowing the stored mechanical potential energy to be converted to electrical energy as was described for the embodiment 200 of FIG. 15. In the embodiment 250, the spring rewinding mechanism 215 can be provided with a release mechanism (not shown) that would release the stored mechanical potential energy of the spring rewinding mechanism 215 only after the stored mechanical potential energy level has reached a predetermined level. In general, this process may require several intermittent rewindings of the spring of the spring rewinding 215. The spring rewinding process is then restarted again from nearly zero stored mechanical potential energy.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

What is claimed is:

1. An apparatus for generating electrical energy from a first motion having a low and/or variable frequency, the apparatus comprising:
a first device to which the first motion is transferred; and
a second device to which the first motion is transferred from the first device, the second device operating at a frequency which is higher and/or more constant that the first motion;
wherein the first device comprises one of a rotating shaft or translating mass;
the shaft or mass includes at least one tip interacting with the second device to transfer the first motion thereto, the second device comprises a member having an electrical energy generator to generate electrical energy; and
one or more magnets arranged on one or both of the at least one tip and member to create a magnetic repulsion force between the at least one tip and member;
wherein one of the at least one tip or member includes a first magnet and the other of the at least one tip or member includes second and third magnets, wherein north and south poles of the first, second and third magnets are arranged such that each of the north poles are repulsed by a north pole and each of the south poles are repulsed by a south pole when the first magnet interacts with the second and third magnets.

2. The apparatus of claim 1, wherein the electrical energy electrical energy generator comprises a piezoelectric generator.

3. The apparatus of claim 1, wherein the electrical energy electrical energy generator comprises a coil and magnet generator.

4. The apparatus of claim 3, wherein the coil and magnet generator is a rotary coil and magnet generator.

5. The apparatus of claim 3, wherein the coil and magnet generator is a linear coil and magnet generator.

6. An apparatus for generating electrical energy from a first motion having a low and/or variable frequency, the apparatus comprising:
a first device to which the first motion is transferred; and
a second device to which the first motion is transferred from the first device, the second device operating at a frequency which is higher and/or more constant that the first motion;
wherein the first device comprises one of a rotating shaft or translating mass;
the shaft or mass includes at least one tip interacting with the second device to transfer the first motion thereto, the second device comprises a member having an electrical energy generator to generate electrical energy; and
one or more magnets arranged on one or both of the at least one tip and member to create a magnetic attraction force between the at least one tip and member;
wherein one of the at least one tip or member includes a first magnet and the other of the at least one tip or member includes second and third magnets, wherein north and south poles of the first, second and third magnets are arranged such that each of the north poles are attracted by a south pole and each of the south poles are attracted by a north pole when the first magnet interacts with the second and third magnets.

7. The apparatus of claim 6, wherein the electrical energy electrical energy generator comprises a piezoelectric generator.

8. The apparatus of claim 6, wherein the electrical energy electrical energy generator comprises a coil and magnet generator.

9. The apparatus of claim 8, wherein the coil and magnet generator is a rotary coil and magnet generator.

10. The apparatus of claim 8, wherein the coil and magnet generator is a linear coil and magnet generator.

11. An apparatus for generating electrical energy from a first motion having a low and/or variable frequency, the apparatus comprising:
a first device to which the first motion is transferred; and
a second device to which the first motion is transferred from the first device, the second device operating at a second motion having a frequency which is higher and/or more constant that the first motion;
wherein the first device comprises one of a first rotating shaft or first translating mass;
the first shaft or first mass includes a tip interacting with the second device to transfer the first motion thereto, the second device comprises a mechanism having an electrical energy generator for converting the second motion to electrical energy; and
the electrical energy generator comprises a rotary coil and magnet generator;
wherein the mechanism of the second device comprises:
a second rotary shaft;
a link attached at a first position on the second rotary shaft, the link having a portion interacting with the first device;
a torsional spring having one end attached to the second rotary shaft; and
the rotary coil and magnet generator being attached to a second position on the second rotary shaft.

12. The Apparatus of claim 11, further comprising a second mass positioned along the length of the link.

13. The Apparatus of claim 11, further comprising one of a one-way clutch or spring rewinding mechanism operatively connected to the second shaft for converting an intermittent motion to a continuous rotary motion.

14. The Apparatus of claim 11, further comprising one or more magnets arranged on one or both of the tip and mechanism to create a magnetic repulsion or attraction force between the tips and mechanism.

15. An Apparatus for generating electrical energy from a first motion having a low and/or variable frequency, the apparatus comprising:
- a first device to which the first motion is transferred; and
- a second device to which the first motion is transferred from the first device, the second device operating at a second motion having a frequency which is higher and/or more constant that the first motion;
- wherein the first device comprises one of a first rotating shaft or first translating mass;
- the first shaft or first mass includes a tip interacting with the second device to transfer the first motion thereto, the second device comprises a mechanism having an electrical energy generator for converting the second motion to electrical energy; and
- the electrical energy generator comprises a linear coil and magnet generator;
- wherein the mechanism of the second device comprises:
  - a second mass movable in a linear direction and having a portion interacting with the first device;
  - a spring attached to a first portion of the second mass;
  - a second shaft attached to a second portion of the second mass; and
  - the linear coil and magnet generator attached to the second shaft.

16. The Apparatus of claim 15, further comprising one or more magnets arranged on one or both of the tip and mechanism to create a magnetic repulsion or attraction force between the tips and mechanism.

17. An apparatus for generating electrical energy from a first motion having a low and/or variable frequency, the apparatus comprising:
- a first device to which the first motion is transferred; and
- a second device to which the first motion is transferred from the first device, the second device operating at a second motion having a frequency which is higher and/or more constant that the first motion;
- wherein the first device comprises one of a first rotating shaft or first translating mass;
- the first shaft or first mass includes a tip interacting with the second device to transfer the first motion thereto, the second device comprises a mechanism having an electrical energy generator for converting the second motion to electrical energy; and
- the electrical energy generator comprises a rotary piezoelectric generator comprising:
  - a rotating second shaft having a portion extending therefrom interacting with the first device;
  - one or more piezoelectric members extending from the second shaft and attached to a structure of the device.

* * * * *